United States Patent
Moriyama

(10) Patent No.: US 10,749,348 B2
(45) Date of Patent: Aug. 18, 2020

(54) POWER CONTROL APPARATUS, CONTROL METHOD FOR POWER CONTROL APPARATUS, POWER CONTROL SYSTEM, AND CONTROL METHOD FOR POWER CONTROL SYSTEM

(71) Applicant: KYOCERA Corporation, Kyoto-shi, Kyoto (JP)

(72) Inventor: Yuichi Moriyama, Yokohama (JP)

(73) Assignee: KYOCERA CORPORATION, Kyoto (JP)

( * ) Notice: Subject to any disclaimer, the term of this patent is extended or adjusted under 35 U.S.C. 154(b) by 307 days.

(21) Appl. No.: 15/771,409

(22) PCT Filed: Oct. 28, 2016

(86) PCT No.: PCT/JP2016/004757
§ 371 (c)(1),
(2) Date: Apr. 27, 2018

(87) PCT Pub. No.: WO2017/073079
PCT Pub. Date: May 4, 2017

(65) Prior Publication Data
US 2018/0309299 A1    Oct. 25, 2018

(30) Foreign Application Priority Data

Oct. 28, 2015  (JP) ................................. 2015-212401
Dec. 24, 2015  (JP) ................................. 2015-252264

(51) Int. Cl.
*H02J 3/38*       (2006.01)
*G01R 31/00*    (2006.01)
(Continued)

(52) U.S. Cl.
CPC ........ *H02J 3/383* (2013.01); *G01R 19/16509* (2013.01); *G01R 31/00* (2013.01);
(Continued)

(58) Field of Classification Search
CPC ... H02J 3/383; H02J 3/38; H02J 3/388; G01R 19/16509; G01R 31/00; G01R 31/3278; H01H 3/001; H01H 47/002; H02M 7/48
See application file for complete search history.

(56) References Cited

U.S. PATENT DOCUMENTS

| | | | |
|---|---|---|---|
| 9,711,967 B1 * | 7/2017 | Czarnecki | ................. H02J 5/00 |
| 9,825,488 B2 * | 11/2017 | Shinomoto | ............. H02J 9/061 |
| 10,389,131 B2 * | 8/2019 | Sasaki | ..................... H02M 7/44 |

(Continued)

FOREIGN PATENT DOCUMENTS

| | | |
|---|---|---|
| JP | 2007-49770 A | 2/2007 |
| JP | 2008-253033 A | 10/2008 |

*Primary Examiner* — Daniel Kessie
(74) *Attorney, Agent, or Firm* — Hauptman Ham, LLP

(57) ABSTRACT

A power control apparatus according to the present disclosure includes a first interconnection relay and a second interconnection relay configured to interconnect or parallel off an inverter to or from a power grid, a reference potential relay configured to set a neutral phase of an independent operation output system to a reference potential, voltage sensors respectively installed between the first interconnection relay and the inverter and between the first interconnection relay and the power grid, voltage sensors respectively installed between the second interconnection relay and the inverter and between the second interconnection relay and the power grid, and a controller configured to turn the reference potential relay on to set the neutral phase to the reference potential and then to judge whether a state of each interconnection relay is normal on the basis of voltage values measured by the voltage sensors.

7 Claims, 16 Drawing Sheets

(51) Int. Cl.
  *H02M 7/48* (2007.01)
  *H01H 3/00* (2006.01)
  *H01H 47/00* (2006.01)
  *G01R 19/165* (2006.01)
  *G01R 31/327* (2006.01)

(52) U.S. Cl.
  CPC ......... *G01R 31/3278* (2013.01); *H01H 3/001* (2013.01); *H01H 47/002* (2013.01); *H02J 3/38* (2013.01); *H02M 7/48* (2013.01); *H02J 3/388* (2020.01)

(56) References Cited

U.S. PATENT DOCUMENTS

| | | | | |
|---|---|---|---|---|
| 2001/0004322 A1* | 6/2001 | Kurokami | ............... | H02J 3/381 363/56.03 |
| 2009/0027932 A1* | 1/2009 | Haines | ............... | H02J 9/062 363/95 |
| 2009/0236916 A1* | 9/2009 | Nishimura | ............... | H02J 3/386 307/80 |
| 2011/0090607 A1* | 4/2011 | Luebke | ............... | H01L 31/02021 361/42 |
| 2011/0121780 A1* | 5/2011 | Fukuo | ............... | B60L 53/18 320/109 |
| 2012/0039101 A1* | 2/2012 | Falk | ............... | H02J 3/383 363/95 |
| 2012/0074953 A1* | 3/2012 | Stickelmann | ............... | G01R 19/16538 324/537 |
| 2014/0049053 A1* | 2/2014 | Inoue | ............... | H02J 3/381 290/30 R |
| 2014/0217826 A1* | 8/2014 | Oguchi | ............... | H02J 3/32 307/46 |
| 2014/0306544 A1* | 10/2014 | Hantschel | ............... | H02J 3/383 307/82 |
| 2014/0327315 A1* | 11/2014 | Baba | ............... | H02J 3/46 307/81 |
| 2014/0333140 A1* | 11/2014 | Baba | ............... | H02J 3/12 307/82 |
| 2015/0069977 A1* | 3/2015 | Elantably | ............... | H02P 9/14 322/58 |
| 2015/0188454 A1* | 7/2015 | Noritake | ............... | H02J 3/383 363/98 |
| 2015/0270787 A1* | 9/2015 | Fujisaki | ............... | G05F 1/563 363/41 |
| 2016/0091554 A1* | 3/2016 | Fornage | ............... | H02S 50/00 324/509 |
| 2017/0005471 A1* | 1/2017 | Kim | ............... | H02M 7/48 |
| 2017/0063268 A1* | 3/2017 | da Silva | ............... | G05B 13/02 |
| 2017/0070172 A1* | 3/2017 | Je | ............... | H02M 7/00 |

* cited by examiner

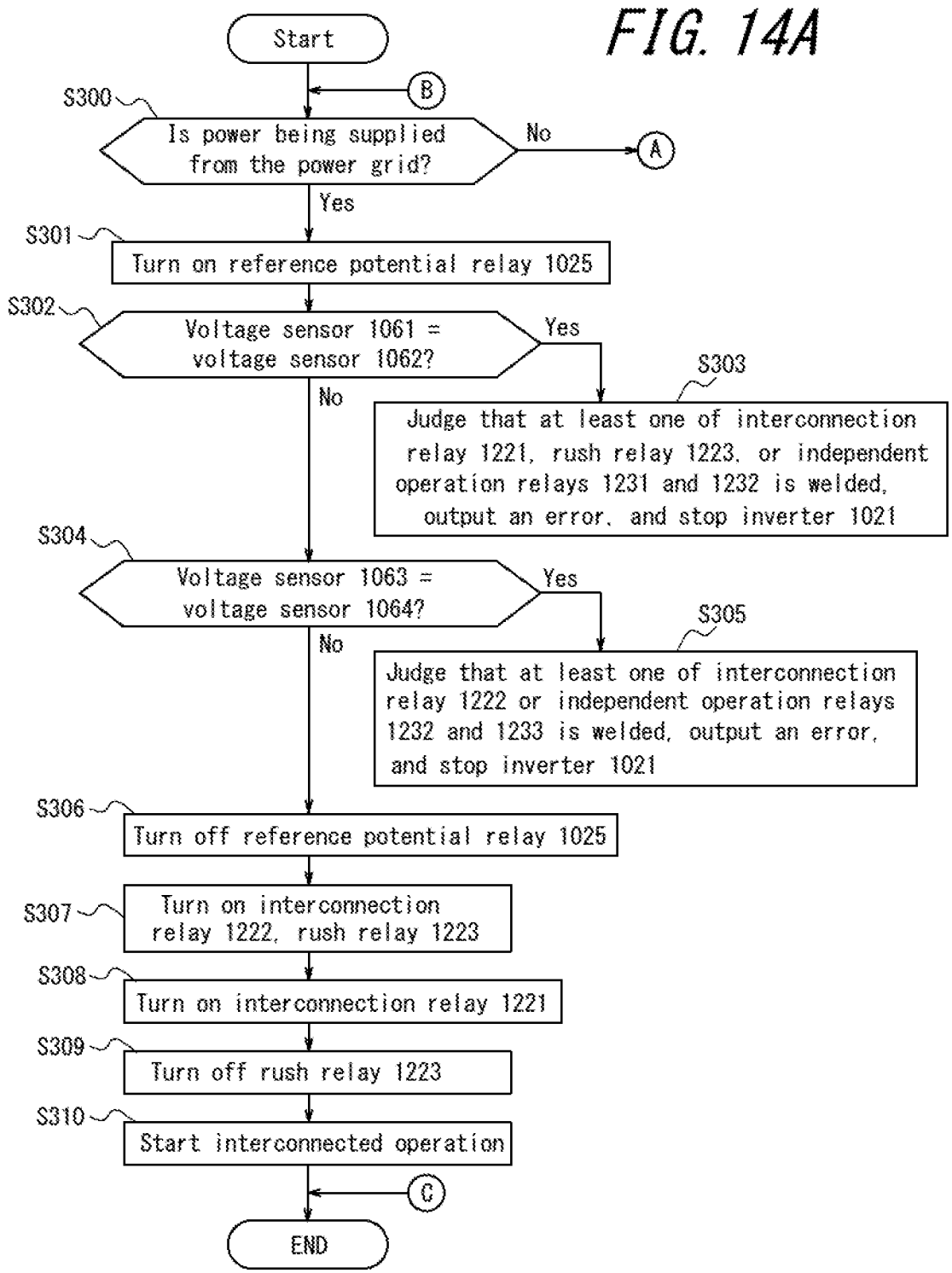

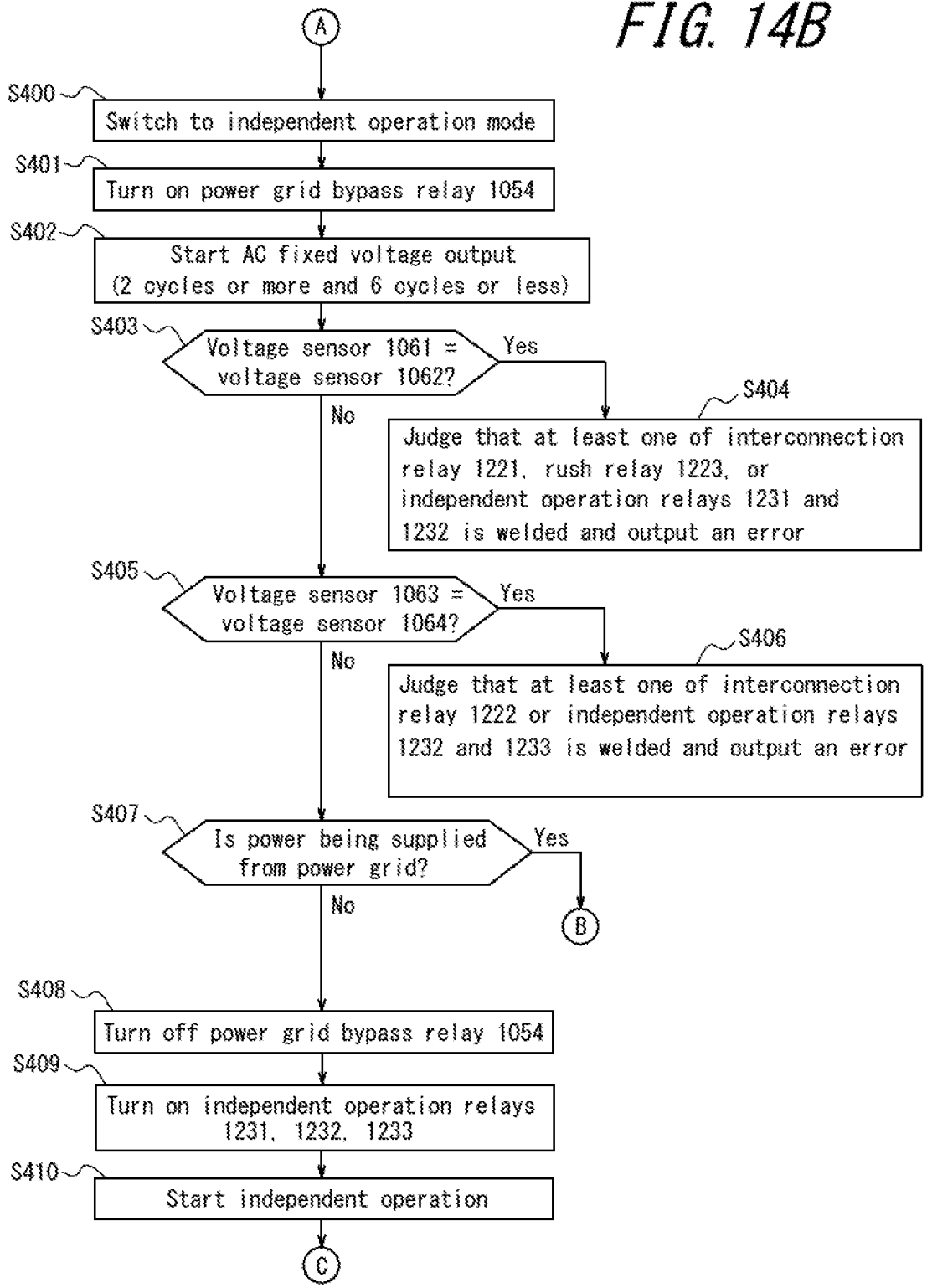

POWER CONTROL APPARATUS, CONTROL METHOD FOR POWER CONTROL APPARATUS, POWER CONTROL SYSTEM, AND CONTROL METHOD FOR POWER CONTROL SYSTEM

CROSS-REFERENCE TO RELATED APPLICATION

The present application is a National Phase of International Application No. PCT/JP2016/004757, filed Oct. 28, 2016, which claims priority to and the benefit of Japanese Patent Application No. 2015-212401 filed Oct. 28, 2015 and Japanese Patent Application No. 2015-252264 filed Dec. 24, 2015.

TECHNICAL FIELD

The present disclosure relates to a power control apparatus, a control method for a power control apparatus, a power control system, and a control method for a power control system.

BACKGROUND

A known power control apparatus for a power generation system provided with power generation equipment, such as a solar panel, is capable of grid interconnected operation and independent operation. During grid interconnected operation, alternating current (AC) power is output while the power generation system is interconnected to a commercial power grid (hereinafter also "power grid"). During independent operation, AC power is output while the power generation system is paralleled off from the power grid.

Like the aforementioned power control apparatus, a known electricity storage power control apparatus for an electricity storage system provided with electricity storage equipment such as a storage cell that is charged by power from the power grid is capable of grid interconnected operation and independent operation.

SUMMARY

A power control apparatus according to the present disclosure comprises first and second interconnection relays, a reference potential relay, a first set of voltage sensors, and a second set of voltage sensors. The first and second interconnection relays interconnect or parallel off an inverter to or from a power grid. The reference potential relay sets a neutral phase of an independent operation output system to a reference potential. The voltage sensors in the first set of voltage sensors are respectively installed between the first interconnection relay and the inverter and between the first interconnection relay and the power grid. The voltage sensors in the second set of voltage sensors are respectively installed between the second interconnection relay and the inverter and between the second interconnection relay and the power grid. The power control apparatus turns the reference potential relay on to set the neutral phase to the reference potential and then judges whether each of the first and second interconnection relays is welded on the basis of voltage values measured by the first and second sets of voltage sensors.

A control method for a power control apparatus according to the present disclosure comprises turning a reference potential relay on to set a neutral phase of an independent operation output system to a reference potential. The control method for a power control apparatus comprises comparing voltage values measured by first and second sets of voltage sensors respectively installed between first and second interconnection relays and an inverter and between the first and second interconnection relays and a power grid, the first and second interconnection relays being configured to interconnect or parallel off the inverter to or from the power grid. The control method for a power control apparatus comprises judging whether each of the first and second interconnection relays is welded.

A power control system according to the present disclosure comprises first and second independent operation relays, a reference potential relay, first and second interconnection relays, a first set of voltage sensors, a second set of voltage sensors, and a relay. The first and second independent operation relays connect an inverter to a load during independent operation. The reference potential relay sets a neutral phase of an independent operation output system to a reference potential. The first and second interconnection relays are located in an interconnected operation output system and interconnect or parallel off the inverter to or from a power grid. The voltage sensors in the first set of voltage sensors are respectively installed between the first interconnection relay and the inverter and between the first interconnection relay and the power grid. The voltage sensors in the second set of voltage sensors are respectively installed between the second interconnection relay and the inverter and between the second interconnection relay and the power grid. The relay is located between the independent operation output system and the interconnected operation output system. The power control system turns the relay and the reference potential relay on and then judges a state of the first and second independent operation relays on the basis of voltage values measured by the first and second sets of voltage sensors.

A control method for a power control system according to the present disclosure comprises turning on a relay located between an independent operation output system and an interconnected operation output system. The control method for a power control system comprises turning a reference potential relay on to set a neutral phase of the independent operation output system to a reference potential. The control method for a power control system comprises comparing voltage values measured by first and second sets of voltage sensors respectively installed between first and second interconnection relays and an inverter and between the first and second interconnection relays and a power grid, the first and second interconnection relays being configured to interconnect or parallel off the inverter to or from the power grid. The control method for a power control system comprises judging a state of first and second independent operation relays.

BRIEF DESCRIPTION OF THE DRAWINGS

In the accompanying drawings:

FIG. 14A is a flowchart illustrating operations at the start of interconnected operation of the power control system according to the second embodiment; and FIG. 14B is a flowchart illustrating operations at the start of independent operation of the power control system according to the second embodiment.

DETAILED DESCRIPTION

To connect to the power grid, a mechanism (such as a relay) to interconnect to and parallel off from the power grid needs to be included. A phenomenon in which the relay does not function normally may occur unintentionally. The phenomenon may, for example, be welding. The state of the relay needs to be detected to determine whether this phenomenon has occurred. The power control apparatus, control method for a power control apparatus, power control system, and control method for a power control system of the present disclosure can detect the state of an interconnection relay.

First Embodiment

First, the overall power control system that includes the power control apparatus according to the first embodiment of the present disclosure is described. In addition to power supplied from the power grid, the power control system that includes the power control apparatus according to the present embodiment is provided with a distributed power source that supplies sellable power and/or a distributed power source that supplies power that cannot be sold by contract. A distributed power source that supplies sellable power is, for example, a system that supplies power by solar power generation or the like. The power grid referred to here is a system combining power generation, transformation, transmission, and distribution necessary for consumer facilities to receive electric power. For example, the power grid includes distribution equipment for consumer facilities to receive the power supply. By sending electric power to the power grid from a distributed power source that supplies sellable power, the surplus power after subtracting the power consumption within the consumer facility from the supplied power may be sold to the power company.

On the other hand, a distributed power source that supplies electric power that cannot be sold by contract may, for example, be a storage cell system that can charge and discharge electric power, a fuel cell system that includes a fuel cell such as a solid oxide fuel cell (SOFC), and a gas power generator system that generates power with gas fuel. The present embodiment illustrates an example of including a solar cell as a distributed power source that supplies sellable power. The present embodiment also illustrates an example of including a storage cell and a power generation apparatus, which is a fuel cell or a gas power generator, as distributed power sources that supply power that cannot be sold by contract. The distributed power sources that are indicated as not being able to sell power by contract in the present embodiment may be able to sell power output by the distributed power sources as a result of changes in the system.

Figure 1:
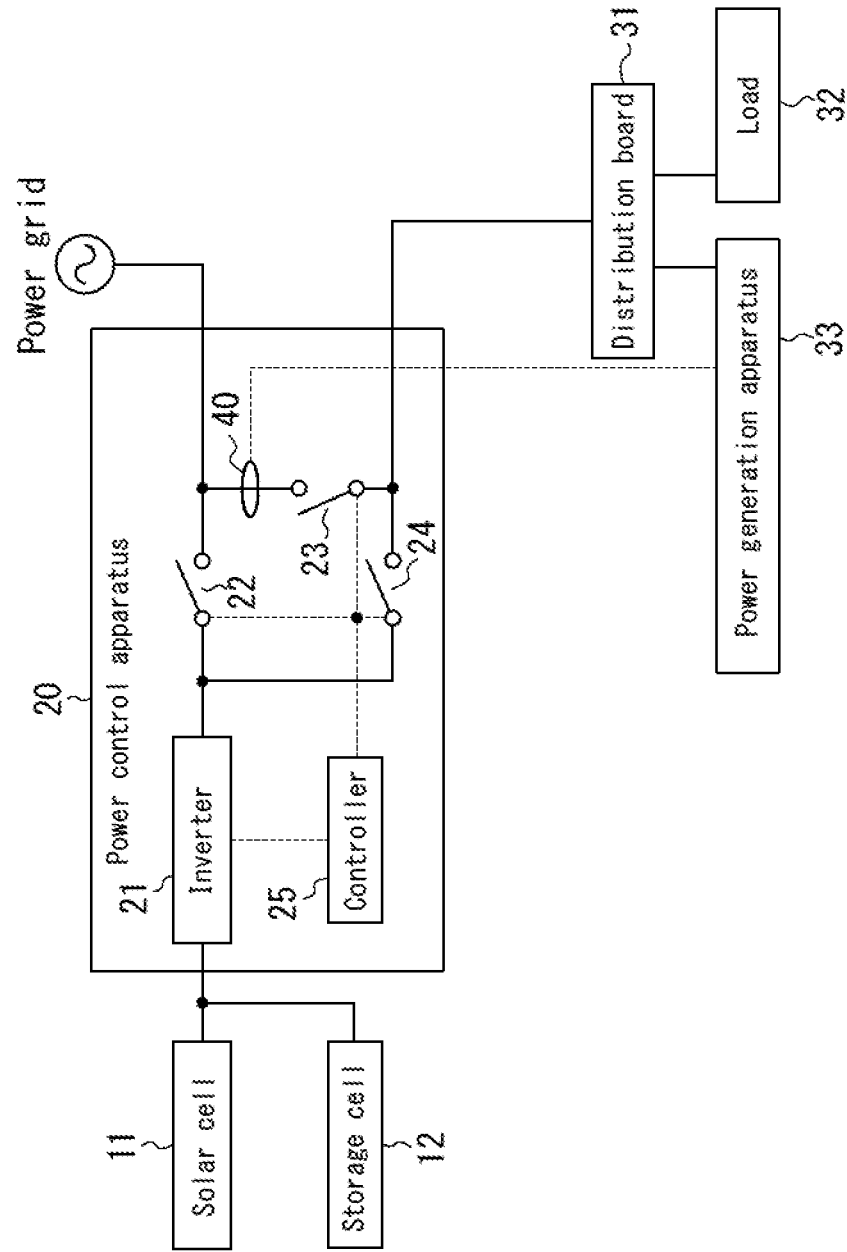
FIG. 1 is a block diagram of a power control system including a power control apparatus according to a first embodiment.

FIG. 1 is a block diagram illustrating the schematic configuration of a power control system including a power control apparatus according to a first embodiment of the present disclosure. The power control system includes a solar cell 11, a storage cell 12, a power control apparatus 20, a distribution board 31, a load 32, a power generation apparatus 33, and a current sensor 40. The power generation apparatus 33 is constituted by a fuel cell or a gas power generator. The power control system usually performs interconnected operation with the power grid. The power control system supplies power from the power grid and power from the distributed power sources (solar cell 11, storage cell 12, power generation apparatus 33) to the load 32.

When there is no power supply from the power grid, for example during a power outage, the power control system performs independent operation. The power control system supplies power from the distributed power sources (solar cell 11, storage cell 12, power generation apparatus 33) to the load 32. When the power control system performs independent operation, the distributed power sources (solar cell 11, storage cell 12, power generation apparatus 33) are in a state of being paralleled off from the power grid. When the power control system performs interconnected operation, the distributed power sources (solar cell 11, storage cell 12, power generation apparatus 33) are in a state of being paralleled to the power grid. Here, the state of being paralleled off from the power grid refers to a state of being electrically disconnected from the power grid, and the state of paralleled to the power grid refers to a state of being electrically connected to the power grid.

The solid lines connecting functional blocks in FIG. 1 represent wiring through which power flows. The dotted lines connecting functional blocks in FIG. 1 represent the flow of control signals or communicated information. The communication represented by the dotted lines may be wired communication or wireless communication. Various schemes may be adopted for communication of control signals and information, including each layer. For example, a short distance communication method such as ZigBee® (ZigBee is a registered trademark in Japan, other countries, or both) or the like may be used in communication of control signals and information. Various transmission media such as infrared communication and power line communication (PLC) may also be used in communication of control signals and information. Moreover, any of various communication protocols defining only the logical layer, such as ZigBee®, Smart Energy Profile 2.0 (SEP 2.0), ECHONET Lite® (ECHONET Lite is a registered trademark in Japan, other countries, or both), or KNX, may be operated on lower layers including the physical layer suitable for each communication.

The solar cell 11 converts energy from sunlight into direct current (DC) electric power. For example, the solar cell 11 is formed by connecting power generators having photoelectric conversion cells in a matrix to output a predetermined short-circuit current (e.g. 10 A). The solar cell 11 may be any type of solar cell capable of photoelectric conversion, such as a polycrystalline silicon solar cell, a monocrystalline silicon solar cell, or a CIGS or other thin-film solar cell.

The storage cell 12 is a storage cell, such as a lead battery, a lithium ion battery, a nickel-metal-hydride battery, a NAS battery, or a redox flow battery. The storage cell 12 may be discharged to supply electric power. The storage cell 12 is chargeable not only with power supplied from the power grid or the solar cell 11 but also with power supplied from the power generation apparatus 33.

The power control apparatus 20 converts DC power supplied from the solar cell 11 and the storage cell 12 and AC power supplied from the power grid and the power generation apparatus 33 and also controls the switching between interconnected operation and independent operation. The power control apparatus 20 includes an inverter 21, interconnection relays 22 and 23, an independent operation relay 24, and a controller 25 that controls the power control apparatus 20 overall. The interconnection relay 23 may be located outside the power control apparatus 20.

The inverter 21 is a bidirectional inverter. The inverter 21 converts DC power supplied from the solar cell 11 and the storage cell 12 into AC power. The inverter 21 also converts AC power supplied from the power grid and the power generation apparatus 33 into DC power. A converter for stepping up the DC power from the solar cell 11 and the storage cell 12 to a predetermined voltage may be provided at a stage preceding the inverter 21.

The interconnection relays 22 and 23 and the independent operation relay 24 are each configured by a relay, transistor, or the like and are controlled to be on or off. As illustrated in the drawing, the independent operation relay 24 is located between the power generation apparatus 33 and the storage cell 12. The interconnection relays 22 and 23 and the independent operation relay 24 are switched synchronously so as not to be on (or off) simultaneously. In greater detail, when the interconnection relays 22 and 23 are turned on, the independent operation relay 24 is turned off synchronously, and the power control apparatus 20 performs interconnected operation. When the interconnection relays 22 and 23 are turned off, the independent operation relay 24 is turned on synchronously, and the power control apparatus 20 performs independent operation. The synchronous control of the interconnection relays 22 and 23 and the independent operation relay 24 is implemented by hardware by branching the control signal wiring for the interconnection relays 22 and 23 to the independent operation relay 24. Here, the on/off state in response to the same control signal may be set independently for each relay. The synchronous control of the interconnection relays 22 and 23 and the independent operation relay 24 may also be implemented by the controller 25 via software.

The controller 25 is, for example, a microcomputer. The controller 25 controls the operations of the inverter 21, the interconnection relays 22 and 23, the independent operation relay 24, and the like on the basis of the state of a power grid voltage increase, a power outage, and the like. During interconnected operation, the controller 25 turns the interconnection relays 22 and 23 on and turns the independent operation relay 24 off. During independent operation, the controller 25 turns the interconnection relays 22 and 23 off and turns the independent operation relay 24 on.

The distribution board 31 separates the electric power supplied by the power grid during interconnected operation into a plurality of branches and distributes the electric power to the load 32. The distribution board 31 separates the electric power supplied from the plurality of distributed power sources (solar cell 11, storage cell 12, power generation apparatus 33) into a plurality of branches and distributes the electric power to the load 32. The load 32 is an electric power load that consumes electric power. Examples of the load 32 include a variety of household electrical appliances such as an air conditioner, microwave oven, and television; machinery and lighting facilities, such as air conditioning equipment and lighting equipment, that are used in commercial and industrial facilities; and the like.

The power generation apparatus 33 is constituted by a fuel cell or a gas power generator. The fuel cell includes a cell that generates DC power using hydrogen through a chemical reaction with oxygen in the air, an inverter that converts the generated DC power to 100 V or 200 V AC power, and other auxiliary equipment. The fuel cell serving as the power generation apparatus 33 is a system that can supply AC power to the load 32 without involving the power control apparatus 20 and is not necessarily designed based on the assumption of being connected to the power control apparatus 20. The fuel cell may thus be a versatile system. The gas power generator generates power by a gas engine that uses a predetermined gas or the like as fuel.

The power generation apparatus 33 generates power while the corresponding current sensor 40 detects current flowing in a first direction. When generating power, the power generation apparatus 33 performs a load-following operation to follow the power consumption of the load 32 or a rated operation at predetermined rated power. The current flowing in the first direction may, for example, be the current flowing in the direction in which the consumer facility buys power, i.e. forward power flow, but is not limited to forward power flow. The range of following during the load-following operation is, for example, 200 W to 700 W. The rated power during the rated operation is, for example, 700 W. The power generation apparatus 33 may perform a load-following operation to follow the power consumption of the load 32 during interconnected operation and may perform a load-following operation or a rated operation at rated power during independent operation. Here, buying power is the antonym of selling power and refers to the consumer facility purchasing electric power from the power company.

The current sensor 40 detects the current flowing between the power grid and the power generation apparatus 33. For example, when the electric power generated by the power generation apparatus 33 is prescribed by contract as not being sellable, the power generation apparatus 33 stops generating power when the current sensor 40 detects current flowing in a second direction towards the power grid. The current flowing in the second direction may, for example, be the current flowing in the direction of selling power from the consumer facility to the power grid, i.e. reverse power flow, but is not limited to reverse power flow. While the current sensor 40 detects forward power flow, the power generation apparatus 33 generates power by a load-following operation or a rated operation on the grounds that the power generation apparatus 33 can supply electric power itself to the load 32. The power control apparatus according to an embodiment of the present disclosure is described below in detail.

Figure 2:
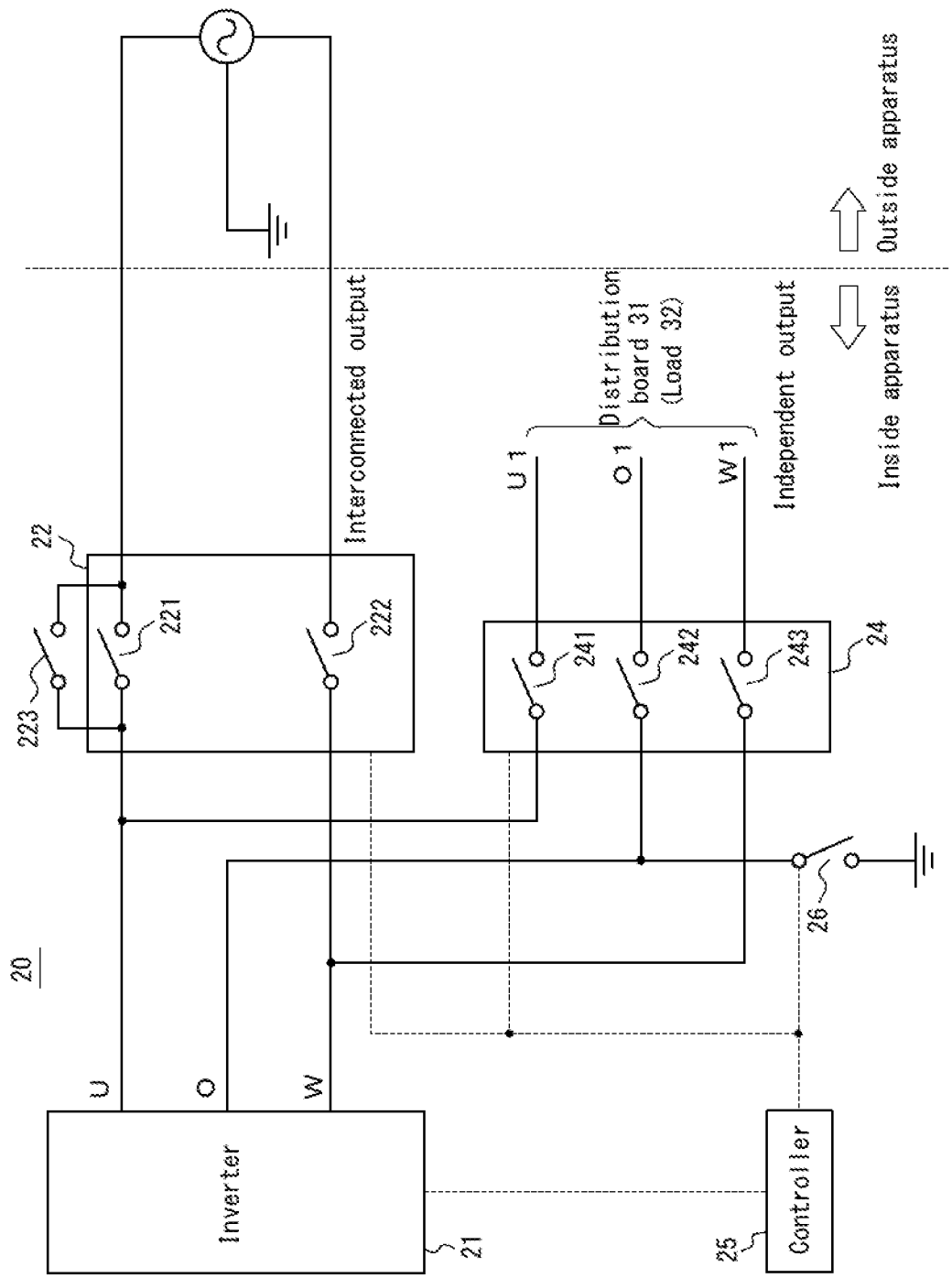
FIG. 2 is a more detailed circuit configuration diagram of the power control apparatus according to the first embodiment.

FIG. 2 is a more detailed circuit configuration diagram related to the power control apparatus 20. In the example in FIG. 2, the power grid is a 200 V single-phase three-wire system. In greater detail, the power control apparatus 20 includes two interconnection relays 221 and 222 (first and second interconnection relays) for interconnecting or paralleling off the inverter 21 to or from the power grid. The interconnection relays 221 and 222 are located inside the power control apparatus 20. To reduce the inrush current, the power control apparatus 20 includes an inrush current reduction relay (rush relay) 223 in parallel with the interconnection relay 221. Here, the inrush current refers to a current, flowing at the start of the power supply, that is larger than the current that regularly flows.

The rush relay 223 is for preventing the interconnection relay 221 from breaking due to inrush current generated at the start of interconnected operation. In FIG. 2, the power control apparatus 20 is illustrated as including the rush relay 223, but embodiments of the present disclosure are not limited to this configuration. For example, the power control apparatus 20 need not include the rush relay 223.

The power control apparatus 20 includes three independent operation relays 241, 242, and 243 for connecting the inverter 21 and the load 32 during independent operation. The voltage lines and neutral line for supplying electric power from the inverter 21 to the load 32 during independent operation branch off from between the inverter 21 and the interconnection relays 221 and 222. The independent operation relays 241, 242, and 243 are located between the branch point and the distribution board 31. In the example in FIG. 2, the independent operation relays 241, 242, and 243 are located inside the power control apparatus 20.

The power control apparatus 20 includes a reference potential relay 26 for setting the neutral phase (O-phase) of the independent operation output system to a reference potential. The reference potential relay 26 is provided in the O-phase. As one example, the reference potential is obtained by grounding the O-phase through the reference potential relay 26. Here, the certification standard of an electricity storage system prescribes grounding of the O-phase of the independent operation output system. This requirement is satisfied by grounding the O-phase through the reference potential relay 26. The reference potential may be 0 V or a different value.

As described above, the power control apparatus 20 includes interconnection relays 221 and 222 that have a mechanism for interconnecting to, or paralleling off from, the power grid during operation or when stopping. In a typical relay, however, a phenomenon in which the relay does not function normally may occur unintentionally, for reasons such as inrush current, vibration, or unintentional shock. The phenomenon may, for example, be welding. Welding is a phenomenon in which a power line inside the relay cannot be separated for the aforementioned reasons. For example, it is assumed that if independent operation starts without the state of the interconnection relays 221 and 222 having been detected before independent operation, then the generated power, which is supposed to be unsellable, from the power generation apparatus 33 may flow in reverse to the power grid. Accordingly, a power control apparatus for detecting the state of the interconnection relays 221 and 222 and a control method for the power control apparatus are necessary.

The state could be detected by a method to confirm the voltage difference between the sides of the relay, but it has proven difficult to detect the state of an individual relay. By detecting the state of an individual relay, a fault location can be identified, thereby preventing the amount of labor and costs from increasing at the time of maintenance or the like. On the other hand, as compared to when a detection circuit having a state detection function is provided inside an individual relay, for example when a peripheral circuit for detection, such as a control circuit, is further included, using the present method can prevent an increase in costs. The present method can also prevent increased complexity as compared to when using a circuit system configured by combining these circuits for detecting the state.

An inexpensive and simple method for individually detecting the state of the interconnection relays 221 and 222 using the power control apparatus according to an embodiment of the present disclosure is described below. Here, a method for detecting the welding state of the interconnection relays 221 and 222 is described. After turning the reference potential relay 26 on and setting the O-phase to the reference potential, the power control apparatus according to an embodiment of the present disclosure judges whether each of the interconnection relays 221 and 222 is welded on the basis of voltage values measured by the below-described sets of voltage sensors. First, the case of the power control apparatus 20 starting interconnected operation with the power grid is described.

Figure 3:
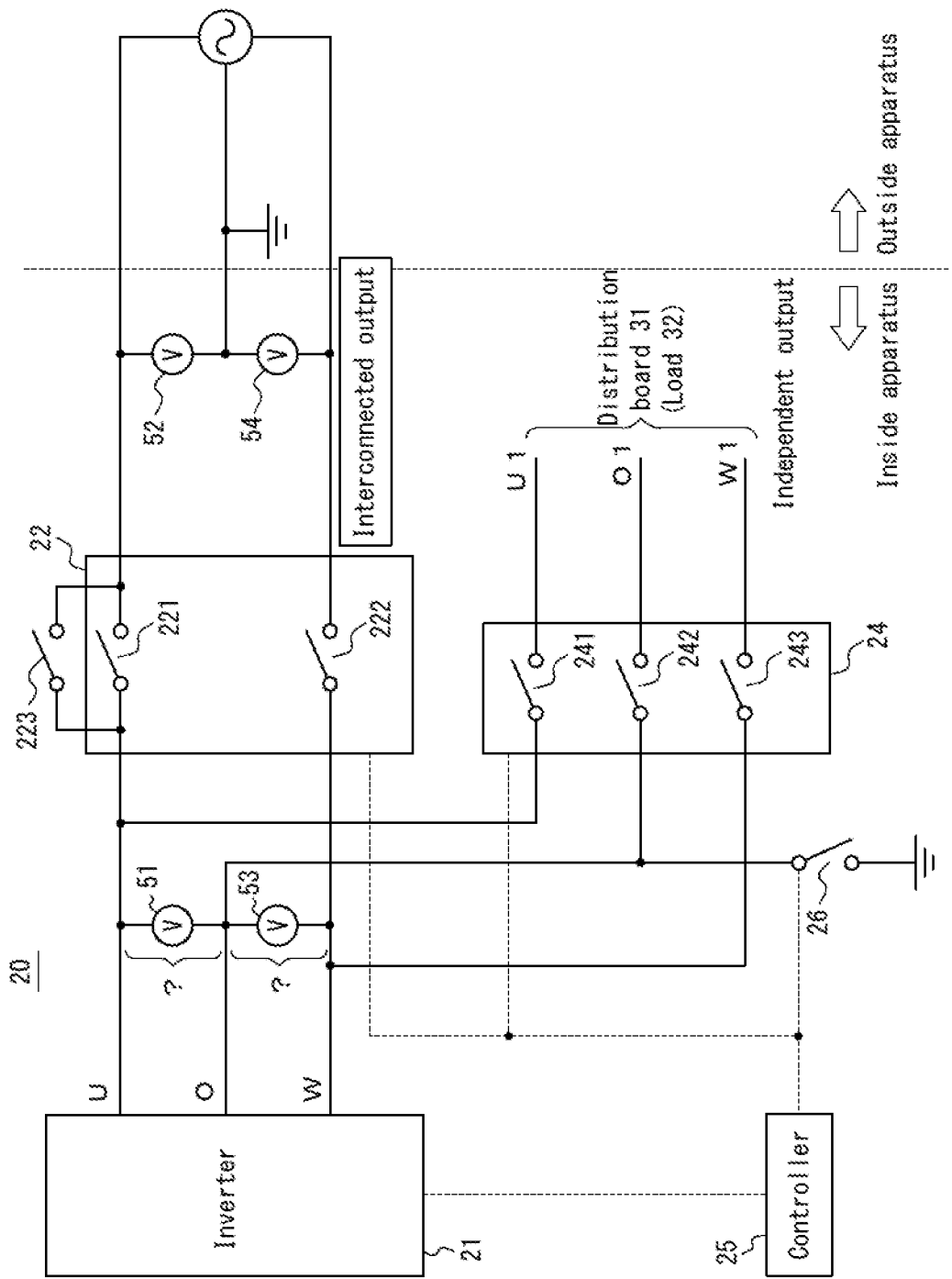
FIG. 3 is a more detailed circuit configuration diagram during interconnected operation of the power control apparatus according to the first embodiment.
Figure 4:
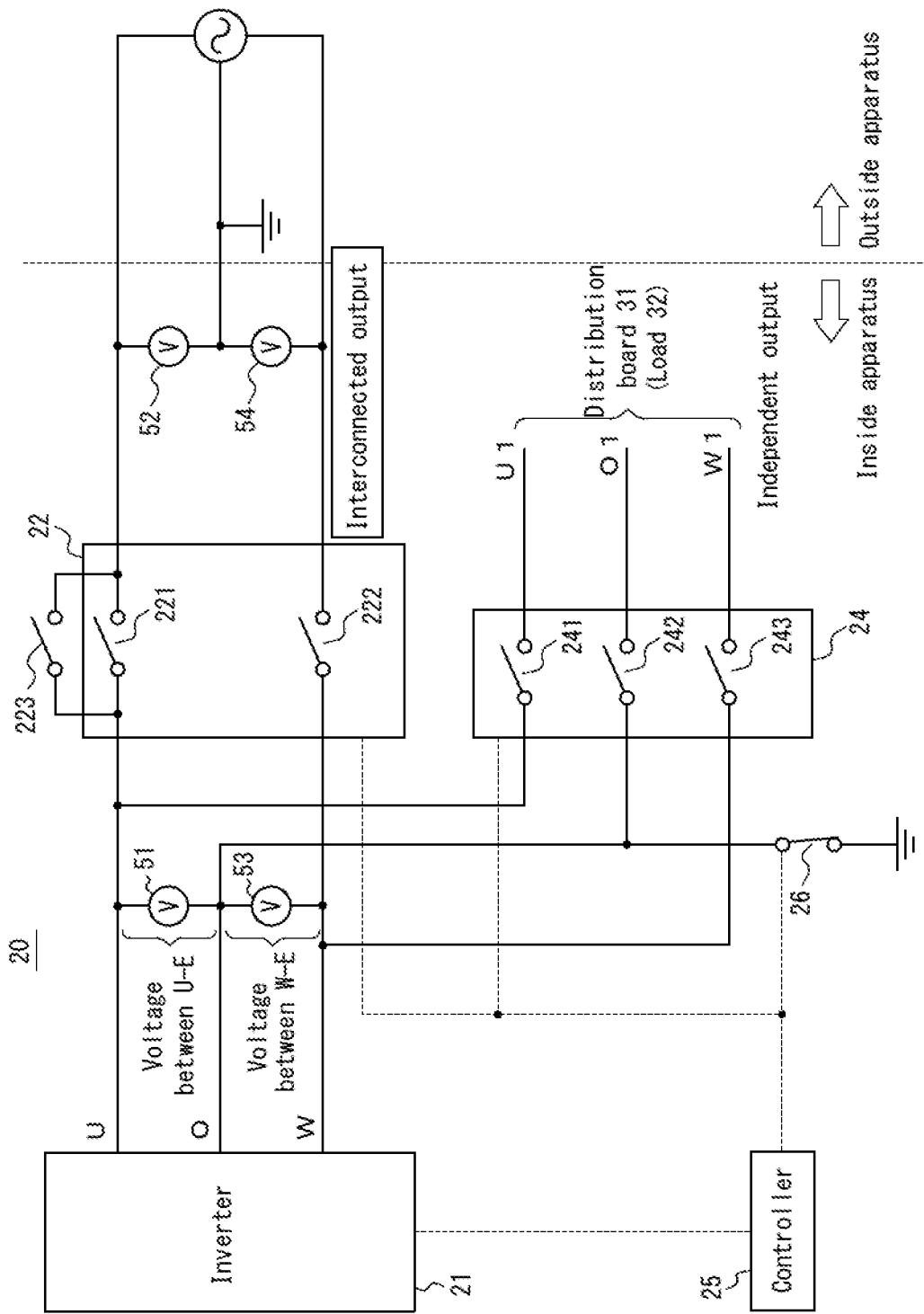
FIG. 4 is a more detailed circuit configuration diagram at the start of interconnected operation of the power control apparatus according to the first embodiment.

FIG. 3 and FIG. 4 are more detailed circuit configuration diagrams related to the power control apparatus 20 during interconnected operation and at the start of interconnected operation. The power control apparatus 20 further includes voltage sensors 51 and 52 (first set of voltage sensors). The voltage sensor 51 is installed between the interconnection relay 221 and the inverter 21, and the voltage sensor 52 is installed between the interconnection relay 221 and the power grid. Similarly, the power control apparatus 20 further includes voltage sensors 53 and 54 (second set of voltage sensors). The voltage sensor 53 is installed between the interconnection relay 222 and the inverter 21, and the voltage sensor 54 is installed between the interconnection relay 222 and the power grid. The installation of voltage sensors in the interconnected operation output system of the power control apparatus that interconnects with the power grid is prescribed. Hence, the voltage sensors 51 to 54 are conventionally installed in accordance with this prescription. In FIG. 3, the voltage sensors 51 and 52 are designated as the first set of voltage sensors, and the voltage sensors 53 and 54 as the second set of voltage sensors, but these designations are not limiting. The designations of the first and second sets of voltage sensors may be switched.

During interconnected operation, the interconnection relays 221 and 222 and the rush relay 223 are used, whereas the independent operation relays 241 to 243 and the reference potential relay 26 normally remain off. In this way, the reference potential relay 26 remains off during interconnected operation, and the potential of the O-phase on the inverter 21 side is not determined. The voltage sensor 51 cannot measure the voltage between the U-phase and the O-phase, and the voltage sensor 53 cannot measure the voltage between the W-phase and the O-phase.

In the power control apparatus according to an embodiment of the present disclosure, the controller 25 newly performs control to turn the reference potential relay 26 on before the start of interconnected operation, as illustrated in FIG. 4. In this way, the O-phase is grounded, and a reference potential (earth (E)) of 0 V is obtained. At this time, the voltage sensor 51 can measure the voltage between the U-phase and the O-phase (U-E) on the inverter 21 side. Furthermore, the voltage sensor 53 can measure the voltage between the W-phase and the O-phase (W-E) on the inverter 21 side. On the power grid side, the O-phase is grounded from the start. Hence, the voltage sensor 52 can measure the voltage between the U-phase and the O-phase (U-E) on the power grid side. Furthermore, the voltage sensor 54 can measure the voltage between the W-phase and the O-phase (W-E) on the power grid side.

Subsequently, the controller 25 judges whether the interconnection relay 221 is welded on the basis of the voltage values measured by the voltage sensors 51 and 52. If these voltage values are the same, the controller 25 judges that either the interconnection relay 221 or the rush relay 223 is not off as normal before the start of interconnected operation and is welded. Hence, the controller 25 outputs an error. The judgment of welding is not limited to the case of the voltage values being the same. The judgment of welding may be made when the difference between the voltage values measured by the voltage sensor 51 and the voltage sensor 52 is within a certain threshold range, such as ±5%. If the voltage values are different, the controller 25 judges that the interconnection relay 221 and the rush relay 223 are not welded. When the power control apparatus 20 does not include the rush relay 223, the controller 25 can judge the welding state for the interconnection relay 221 alone.

Similarly, the controller 25 judges whether the interconnection relay 222 is welded on the basis of the voltage values measured by the voltage sensors 53 and 54. If these voltage values are the same, the controller 25 judges that the interconnection relay 222 is not off as normal before the start of interconnected operation and is welded. Hence, the controller 25 outputs an error. If the voltage values are different, the controller 25 judges that the interconnection relay 222 is not welded.

By performing the above control, the power control apparatus according to an embodiment of the present disclosure can judge the welding state of each of the interconnection relays 221 and 222 at the start of interconnected operation by using only simple relays, without using expensive relays individually provided with a detection circuit having a welding detection function. In other words, the power control apparatus according to an embodiment of the present disclosure achieves inexpensive, simple, and individual detection of the welding state of the interconnection relays 221 and 222.

Figure 5:
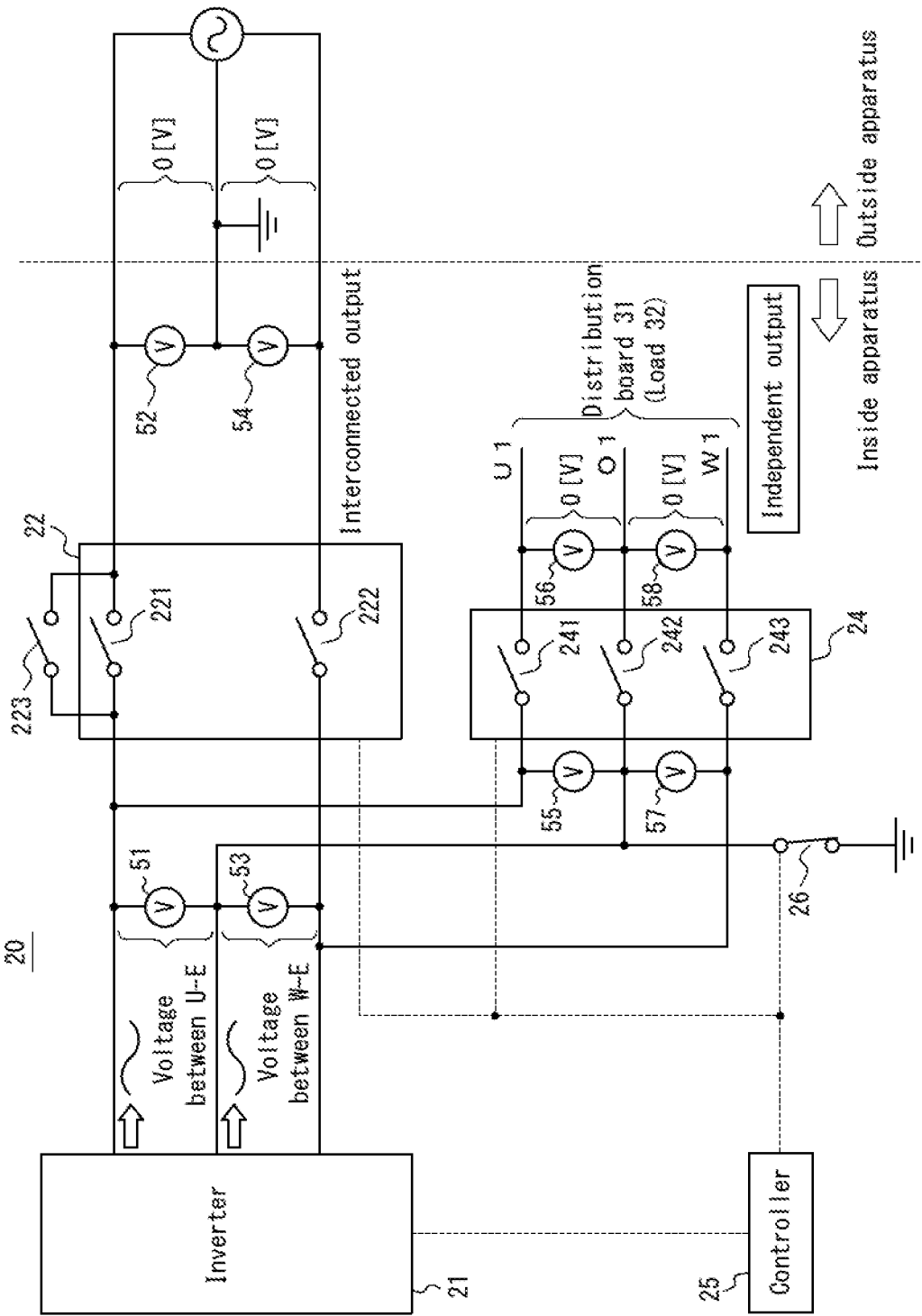
FIG. 5 is a more detailed circuit configuration diagram during independent operation of the power control apparatus according to the first embodiment.

Next, the case of the power control apparatus 20 starting independent operation is described. FIG. 5 is a more detailed circuit configuration diagram related to the power control apparatus 20 during independent operation. The power control apparatus 20 may further include voltage sensors 55 and 56 (third set of voltage sensors). The voltage sensor 55 is installed between the independent operation relay 241 (first independent operation relay) and the inverter 21, and the voltage sensor 56 is installed between the independent operation relay 241 and the distribution board 31 (load 32). Similarly, the power control apparatus 20 may further include voltage sensors 57 and 58 (fourth set of voltage sensors). The voltage sensor 57 is installed between the independent operation relay 243 (second independent operation relay) and the inverter 21, and the voltage sensor 58 is installed between the independent operation relay 243 and the distribution board 31 (load 32). Unlike the voltage sensors 51 to 54, installation of voltage sensors in the independent operation output system of the power control apparatus that connects to the load 32 is not prescribed. The voltage sensors 55 to 58, however, may be installed in the independent operation output system to detect the welding state of the independent operation relays 241 to 243. In FIG. 5, the independent operation relay 241 is designated as the first independent operation relay, and the independent operation relay 243 is designated as the second independent operation relay, but the present disclosure is not limited to these designations. Similarly, the voltage sensors 55 and 56 are designated as the third set of voltage sensors, and the voltage sensors 57 and 58 as the fourth set of voltage sensors, but the present disclosure is not limited to these designations. The designations of the third and fourth sets of voltage sensors may be switched.

During independent operation, the independent operation relays 241 to 243 and the reference potential relay 26 are used, whereas the interconnection relays 221 and 222 and the rush relay 223 remain off. If the reference potential relay 26 also remains off, then as described above, the potential of the O-phase is not determined, and the voltage sensors 51, 53, and 55 to 58 cannot measure the corresponding voltage between the U-phase and the O-phase and the voltage between the W-phase and the O-phase.

In the power control apparatus according to an embodiment of the present disclosure, the controller 25 newly performs control to turn the reference potential relay 26 on before the start of independent operation as well, as illustrated in FIG. 5. In this way, the O-phase is grounded, and a reference potential (earth (E)) of 0 V is obtained.

First, a method by which the controller 25 judges the welding state of each of the interconnection relays 221 and 222 is described. Unlike during interconnected operation, power from the power grid is not supplied during independent operation. The inverter 21 thus outputs a micro voltage before the start of independent operation. The micro voltage is AC voltage with an output time corresponding to 1 cycle or more of AC voltage. A micro voltage output for less than 1 cycle may lead to misdetection during welding detection. Hence, the reason for outputting micro voltage for 1 cycle or more may also be to increase detection accuracy. An excessively long output time is time consuming, however, and the micro voltage might not be distinguishable from electric power flowing during interconnected operation. Therefore, the output time can, for example, be set to 1 cycle or more and 10 cycles or less. The output time may, for example, be set to 2 cycles or more and 6 cycles or less.

It suffices for the voltage value of the micro voltage to be set to a value sufficiently lower than AC 100 V. Specifically, the micro voltage can, for example, be set to a value that is larger than AC 0 V and is AC 10 V or less. Considering the pain felt during contact by the operator, the micro voltage may be set to a value that is larger than AC 0 V and is AC 5 V or less.

By the inverter 21 outputting a micro voltage, the voltage sensors 51 to 54 can measure the respective voltages. If the interconnection relays 221 and 222 and the rush relay 223 are not welded, i.e. if these relays are off as normal, then power is not supplied from the power grid, and the voltage values of the voltage sensors 52 and 54 become 0 V. On the other hand, if the interconnection relay 221 or the rush relay 223 is welded, the voltage value of the voltage sensor 52 becomes the same as the voltage value of the voltage sensor 51. Similarly, if the interconnection relay 222 is welded, the voltage value of the voltage sensor 54 becomes the same as the voltage value of the voltage sensor 53.

The controller 25 judges whether the interconnection relay 221 is welded on the basis of the voltage values measured by the voltage sensors 51 and 52. If these voltage values are the same, the controller 25 judges that either the interconnection relay 221 or the rush relay 223 is not off as normal before the start of independent operation and is welded. Hence, the controller 25 outputs an error. If the voltage values are different, the controller 25 judges that the interconnection relay 221 and the rush relay 223 are not welded. When the power control apparatus 20 does not include the rush relay 223, the controller 25 can judge the welding state for the interconnection relay 221 alone.

Similarly, the controller 25 judges whether the interconnection relay 222 is welded on the basis of the voltage values measured by the voltage sensors 53 and 54. If these voltage values are the same, the controller 25 judges that the interconnection relay 222 is not off as normal before the start of independent operation and is welded. Hence, the controller 25 outputs an error. If the voltage values are different, the controller 25 judges that the interconnection relay 222 is not welded.

Next, a method by which the controller 25 judges the welding state of the independent operation relays 241 to 243 is described. As described above, the inverter 21 outputs a micro voltage before the start of independent operation, because power from the power grid is not supplied during independent operation.

By the inverter 21 outputting a micro voltage, the voltage sensors 55 to 58 can measure the respective voltages. If the independent operation relays 241 to 243 are not welded, i.e. if these relays are off as normal before the start of independent operation, then the voltage values of the voltage sensors 56 and 58 become 0 V. On the other hand, if the independent operation relay 241 or 242 is welded, the voltage value of the voltage sensor 56 becomes the same as the voltage value of the voltage sensor 55. Similarly, if the independent operation relay 242 or 243 is welded, the voltage value of the voltage sensor 58 becomes the same as the voltage value of the voltage sensor 57.

The controller 25 judges whether the independent operation relay 241 or 242 is welded on the basis of the voltage values measured by the voltage sensors 55 and 56. If these voltage values are the same, the controller 25 judges that the independent operation relay 241 or 242 is not off as normal before the start of independent operation and is welded. Hence, the controller 25 outputs an error. If the voltage values are different, the controller 25 judges that the independent operation relays 241 and 242 are not welded.

Similarly, the controller 25 judges whether the independent operation relay 242 or 243 is welded on the basis of the voltage values measured by the voltage sensors 57 and 58. If these voltage values are the same, the controller 25 judges that the independent operation relay 242 or 243 is not off as normal before the start of independent operation and is welded. Hence, the controller 25 outputs an error. If the voltage values are different, the controller 25 judges that the independent operation relays 242 and 243 are not welded.

If the voltage values of the third set of voltage sensors differ, and moreover the voltage values of the fourth set of voltage sensors differ, then the controller 25 can judge that none of the independent operation relays 241 to 243 is welded. If the voltage values of the third set of voltage sensors differ but the voltage values of the fourth set of voltage sensors are the same, then the controller 25 can judge that only the independent operation relay 243 is welded. If the voltage values of the third set of voltage sensors are the same but the voltage values of the fourth set of voltage sensors differ, then the controller 25 can judge that only the independent operation relay 241 is welded.

The power control apparatus according to an embodiment of the present disclosure can thus judge the welding state of relays inside the power control apparatus 20 even at the start of independent operation by using only simple relays, without using expensive relays individually provided with a detection circuit having a welding detection function. In particular, the power control apparatus according to an embodiment of the present disclosure achieves inexpensive, simple, and individual detection of the welding state of the interconnection relays 221 and 222 inside the power control apparatus 20.

Figure 6A:
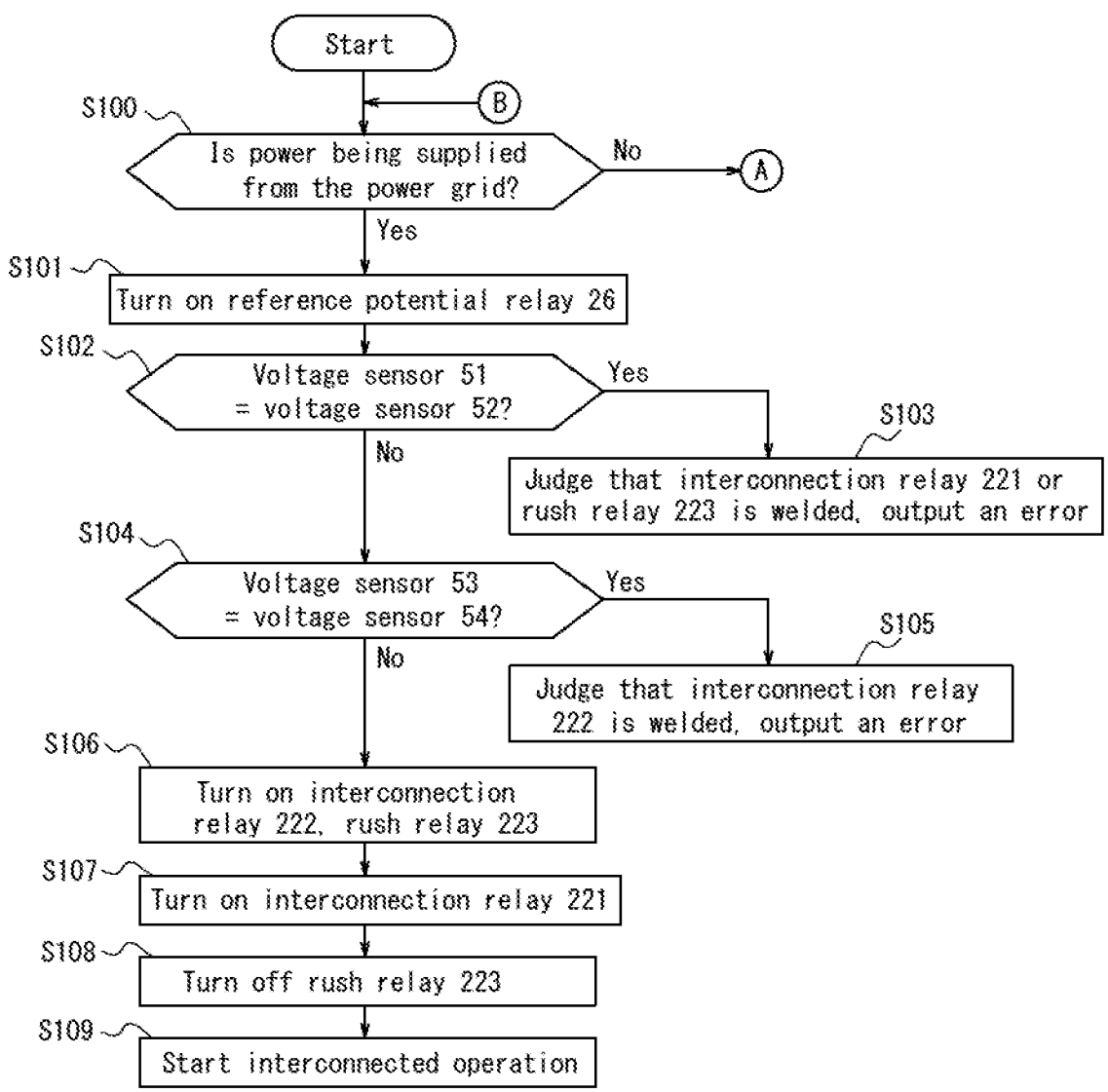
FIG. 6A is a flowchart illustrating operations at the start of interconnected operation of the power control apparatus according to the first embodiment.
Figure 6B:
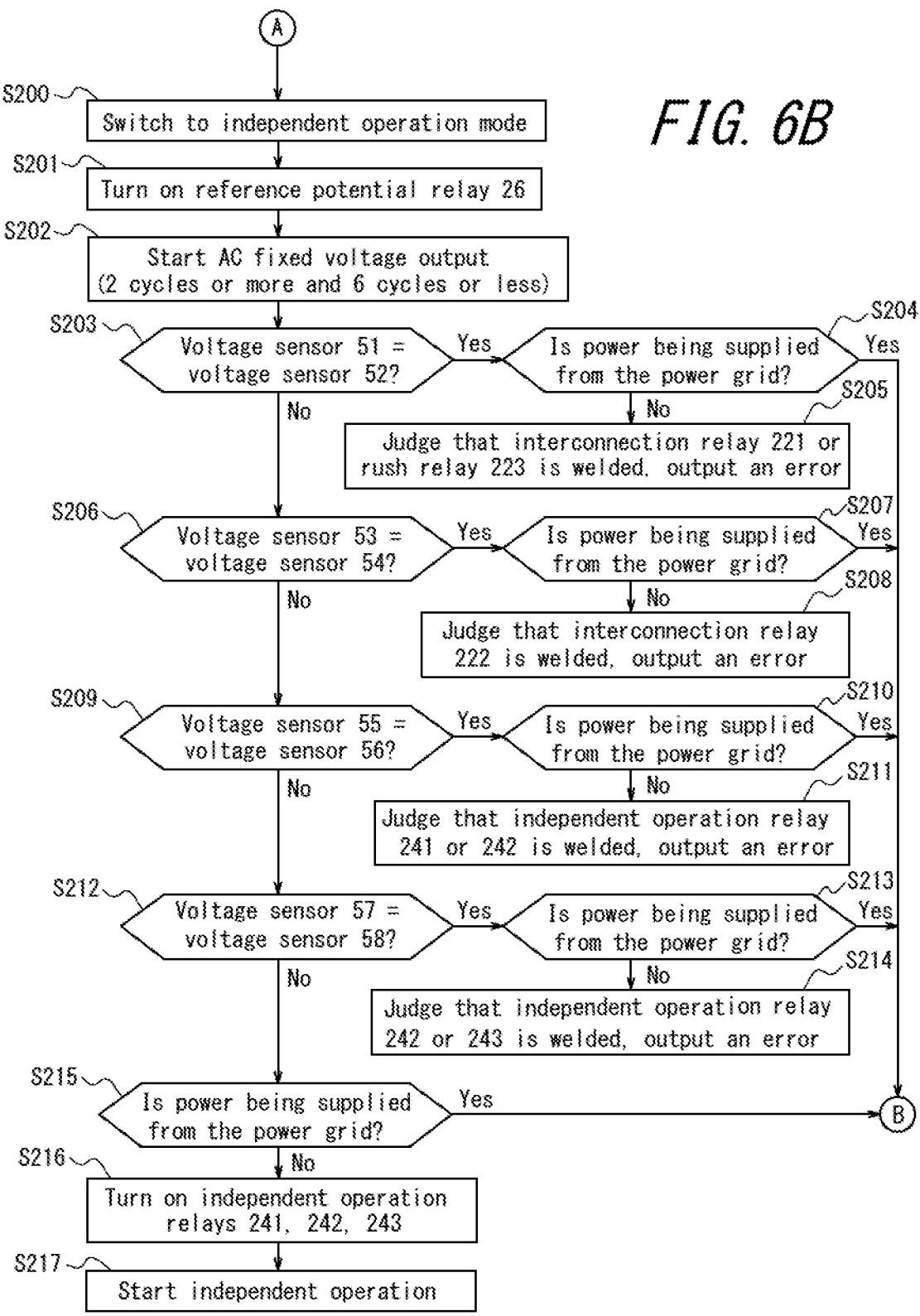
FIG. 6B is a flowchart illustrating operations at the start of independent operation of the power control apparatus according to the first embodiment.

Next, with reference to the flowcharts in FIG. 6A and FIG. 6B, the operations of the power control apparatus according to an embodiment of the present disclosure are described. The operations of the power control apparatus differ between the start of interconnected operation and the start of independent operation.

The controller 25 confirms whether power is being supplied from the power grid (step S100). When power is being supplied from the power grid, the process proceeds to step S101. When power is not being supplied from the power grid, the process proceeds to step S200 in FIG. 6B. First, the operations at the start of interconnected operation are described with reference to FIG. 6A.

The controller 25 turns the reference potential relay 26 on (step S101). In this way, the O-phase is grounded, and a reference potential of 0 V is obtained.

Next, the controller 25 compares the voltage values measured by the voltage sensors 51 and 52 (step S102). If the voltage values are the same, the process proceeds to step S103. If the voltage values are different, the process proceeds to step S104.

When the voltage values are the same, the controller 25 judges that the interconnection relay 221 or the rush relay 223 is welded and outputs an error (step S103).

If the voltage values are different, the controller 25 judges that the interconnection relay 221 and the rush relay 223 are not welded and then compares the voltage values measured by the voltage sensors 53 and 54 (step S104). If the voltage values are the same, the process proceeds to step S105. If the voltage values are different, the process proceeds to step S106.

When the voltage values are the same, the controller 25 judges that the interconnection relay 222 is welded and outputs an error (step S105).

When the voltage values are different, the controller 25 keeps the interconnection relay 222 and the rush relay 223 on, because by the above operations, the controller 25 has detected that the interconnection relays 221 and 222 and the rush relay 223 are not welded (step S106).

Subsequently, after the inrush current generated at the start of interconnected operation subsides, the controller 25 turns the interconnection relay 221 on (step S107).

The controller 25 then turns the rush relay 223 off (step S108).

After the above operations, interconnected operation starts (step S109).

Next, the operations at the start of independent operation are described with reference to FIG. 6B.

When power is not being supplied from the power grid, the controller 25 switches to independent operation mode (step S200).

Subsequently, the controller 25 turns the reference potential relay 26 on (step S201). In this way, the O-phase is grounded, and a reference potential of 0 V is obtained.

Next, the inverter 21 outputs AC voltage (step S202). The output time of the AC voltage may be 2 cycles or more and 6 cycles or less of the AC voltage.

Next, the controller 25 compares the voltage values measured by the voltage sensors 51 and 52 (step S203). If the voltage values are the same, the process proceeds to step S204. If the voltage values are different, the process proceeds to step S206.

In the case of the voltage values being the same, the controller 25 reconfirms whether power is being supplied from the power grid (step S204). This is to confirm whether power has been restored unintentionally at the start of independent operation. When power is being supplied from the power grid and has been restored unintentionally, the process returns to step S100. When power is not being supplied from the power grid, the process proceeds to step S205.

Subsequently, the controller 25 judges that the interconnection relay 221 or the rush relay 223 is welded and outputs an error (step S205).

If the voltage values are different, the controller 25 judges that the interconnection relay 221 and the rush relay 223 are not welded and then compares the voltage values measured by the voltage sensors 53 and 54 (step S206). If the voltage values are the same, the process proceeds to step S207. If the voltage values are different, the process proceeds to step S209.

In the case of the voltage values being the same, the controller 25 reconfirms whether power is being supplied from the power grid (step S207). This is to confirm whether power has been restored unintentionally at the start of independent operation. When power is being supplied from the power grid and has been restored unintentionally, the process returns to step S100. When power is not being supplied from the power grid, the process proceeds to step S208.

Subsequently, the controller 25 judges that the interconnection relay 222 is welded and outputs an error (step S208).

If the voltage values are different, the controller 25 judges that the interconnection relay 222 is not welded and then compares the voltage values measured by the voltage sensors 55 and 56 (step S209). If the voltage values are the same, the process proceeds to step S210. If the voltage values are different, the process proceeds to step S212.

In the case of the voltage values being the same, the controller 25 reconfirms whether power is being supplied from the power grid (step S210). This is to confirm whether power has been restored unintentionally at the start of independent operation. When power is being supplied from the power grid and has been restored unintentionally, the process returns to step S100. When power is not being supplied from the power grid, the process proceeds to step S211.

Subsequently, the controller 25 judges that the independent operation relay 241 or 242 is welded and outputs an error (step S211).

If the voltage values are different, the controller 25 judges that the independent operation relays 241 and 242 are not welded and then compares the voltage values measured by the voltage sensors 57 and 58 (step S212). If the voltage values are the same, the process proceeds to step S213. If the voltage values are different, the process proceeds to step S215.

In the case of the voltage values being the same, the controller 25 reconfirms whether power is being supplied from the power grid (step S213). This is to confirm whether power has been restored unintentionally at the start of independent operation. When power is being supplied from the power grid and has been restored unintentionally, the process returns to step S100. When power is not being supplied from the power grid, the process proceeds to step S214.

Subsequently, the controller 25 judges that the independent operation relay 242 or 243 is welded and outputs an error (step S214).

In the case of the voltage values being different, the controller 25 judges that the independent operation relays 242 and 243 are not welded and reconfirms whether power is being supplied from the power grid (step S215). When power is being supplied from the power grid and has been restored unintentionally, the process returns to step S100. When power is not being supplied from the power grid, the process proceeds to step S216.

The controller 25 turns the independent operation relays 241, 242, and 243 on, because by the above operations, the controller 25 has detected that the interconnection relays 221 and 222, the rush relay 223, and the independent operation relays 241, 242, and 243 are not welded (step S216).

As a result, independent operation starts (step S217).

The power control apparatus according to an embodiment with the above configuration can thus judge the welding state of relays inside the power control apparatus 20 at the start of interconnected operation and at the start of independent operation by using simple relays, without using expensive relays individually provided with a detection circuit having a welding detection function. In particular, the power control apparatus according to an embodiment of the present disclosure achieves inexpensive, simple, and individual detection of the welding state of the interconnection relays 221 and 222 inside the power control apparatus 20.

Second Embodiment

A second embodiment is described next. A description of the second embodiment is omitted as appropriate for points identical to the first embodiment.

Figure 7:
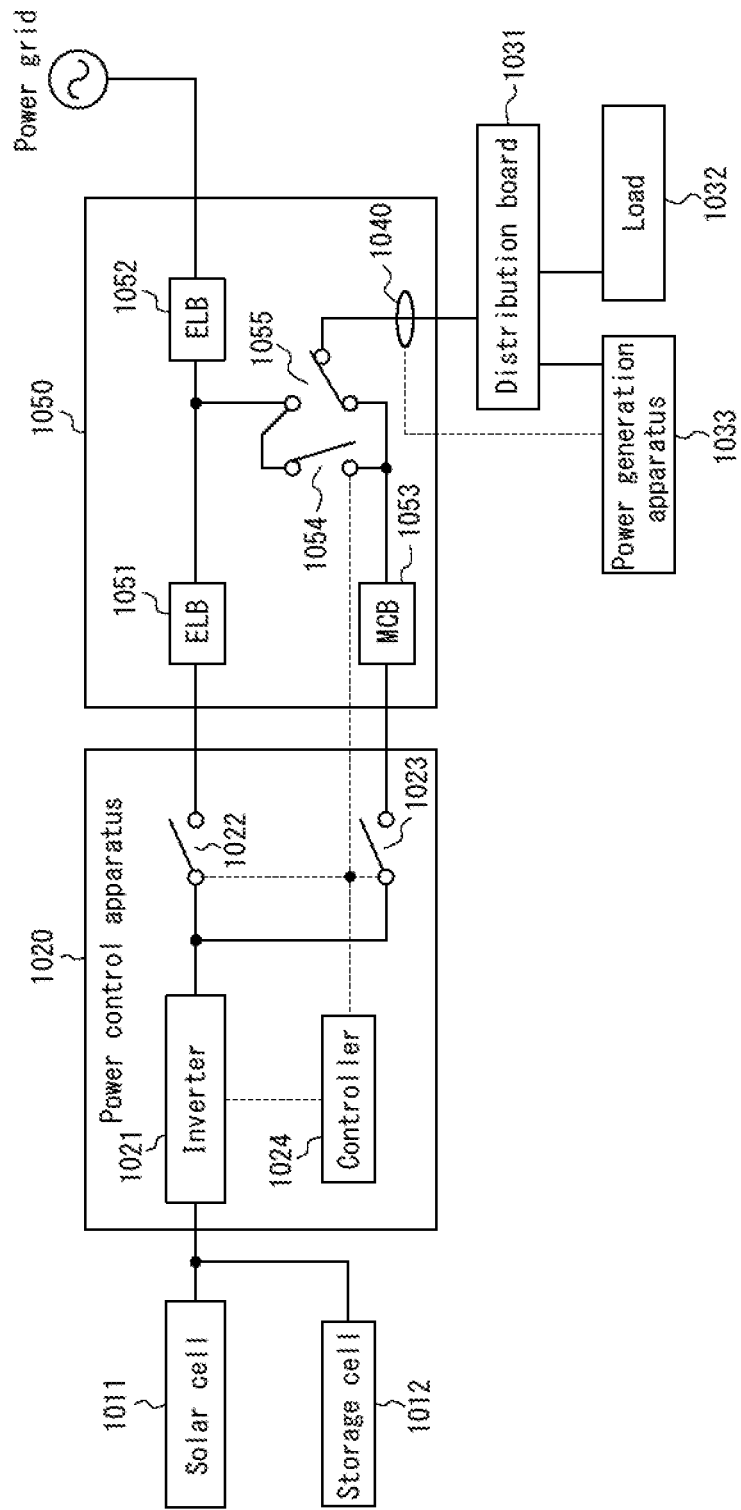
FIG. 7 is a block diagram of the schematic configuration of a power control system according to a second embodiment.

First, the overall power control system according to the second embodiment is described. In addition to power supplied from the power grid, the power control system according to the present embodiment is provided with a distributed power source that supplies sellable power and/or a distributed power source that supplies power that cannot be sold by contract. FIG. 7 is a block diagram of the schematic configuration of the power control system according to an embodiment. The power control system according to the present embodiment includes a solar cell 1011, a storage cell 1012, a power control apparatus 1020, a distribution board 1031, a load 1032, a power generation apparatus 1033, a current sensor 1040, and a distribution board 1050. As the functions of the solar cell 1011 and the storage cell 1012 are the same as those of the solar cell 11 and the storage cell 12 in the first embodiment, a description thereof is omitted.

The power control apparatus 1020 converts DC power supplied from the solar cell 1011 and the storage cell 1012 and AC power supplied from the power grid and the power generation apparatus 1033 and also controls the switching between interconnected operation and independent operation. The power control apparatus 1020 includes an inverter 1021, an interconnection relay 1022, an independent operation relay 1023, and a controller 1024 that controls the power control apparatus 1020 overall.

The inverter 1021 is a bidirectional inverter that converts DC power supplied from the solar cell 1011 and the storage cell 1012 into AC power and converts AC power supplied from the power grid and the power generation apparatus 1033 into DC power. A converter for stepping up the DC power from the solar cell 1011 and the storage cell 1012 to a predetermined voltage may be provided at a stage preceding the inverter 1021.

The interconnection relay 1022 and the independent operation relay 1023 are each configured by a relay, transistor, or the like and are controlled to be on or off. As illustrated in the drawing, the independent operation relay 1023 is located between the power generation apparatus 1033 and the storage cell 1012. The interconnection relay 1022 and the independent operation relay 1023 are switched synchronously so as not to be on (or off) simultaneously. In greater detail, when the interconnection relay 1022 is turned on, the independent operation relay 1023 is turned off synchronously, and the power control apparatus 1020 performs interconnected operation. When the interconnection relay 1022 is turned off, the independent operation relay 1023 is turned on synchronously, and the power control apparatus 1020 performs independent operation. The synchronous control of the interconnection relay 1022 and the independent operation relay 1023 is implemented by hardware by branching the control signal wiring for the interconnection relay 1022 to the independent operation relay 1023. The on/off state in response to the same control signal may be set independently for each relay. The synchronous control of the interconnection relay 1022 and the independent operation relay 1023 may also be implemented by the controller 1024 via software.

The controller 1024 is, for example, a microcomputer and controls the operations of the inverter 1021, the interconnection relay 1022, the independent operation relay 1023, and the like on the basis of the state of a power grid voltage increase, a power outage, and the like. During interconnected operation, the controller 1024 turns the interconnection relay 1022 on and turns the independent operation relay 1023 off. During independent operation, the controller 1024 turns the interconnection relay 1022 off and turns the independent operation relay 1023 on.

As the functions of the distribution board 1031, power generation apparatus 1033, and current sensor 1040 are the same as those of the distribution board 31, power generation apparatus 33, and current sensor 40 in the first embodiment respectively, a description thereof is omitted.

On the inside, the distribution board 1050 includes earth leakage breakers (ELB) 1051 and 1052, a miniature circuit breaker (MCB) 1053, and two relays (power grid bypass relay 1054 and changeover switch 1055). The ELBs 1051 and 1052 operate when earth leakage occurs. In other words, the ELBs 1051 and 1052 automatically shut off the flow of electric power when electrical wiring or an electrical appliance leaks electricity. The MCB 1053 is a small breaker for a consumer facility.

The power grid bypass relay 1054 is electrically controlled to be on or off in accordance with the presence of power grid voltage. Specifically, the power grid bypass relay 1054 turns on when power grid voltage is present and turns off when power grid voltage is absent. The changeover switch 1055 is a relay that is manually switched on or off. If the power control apparatus 1020 were to malfunction and the distribution board 1050 only included the power grid bypass relay 1054, power could no longer be supplied from the power grid to the load 1032. If the changeover switch 1055 is further included, however, and an operator switches the changeover switch 1055 manually, the distribution board 1050 can supply power from the power grid even during the aforementioned malfunction.

The power control system according to an embodiment is described in detail below.

Figure 8:
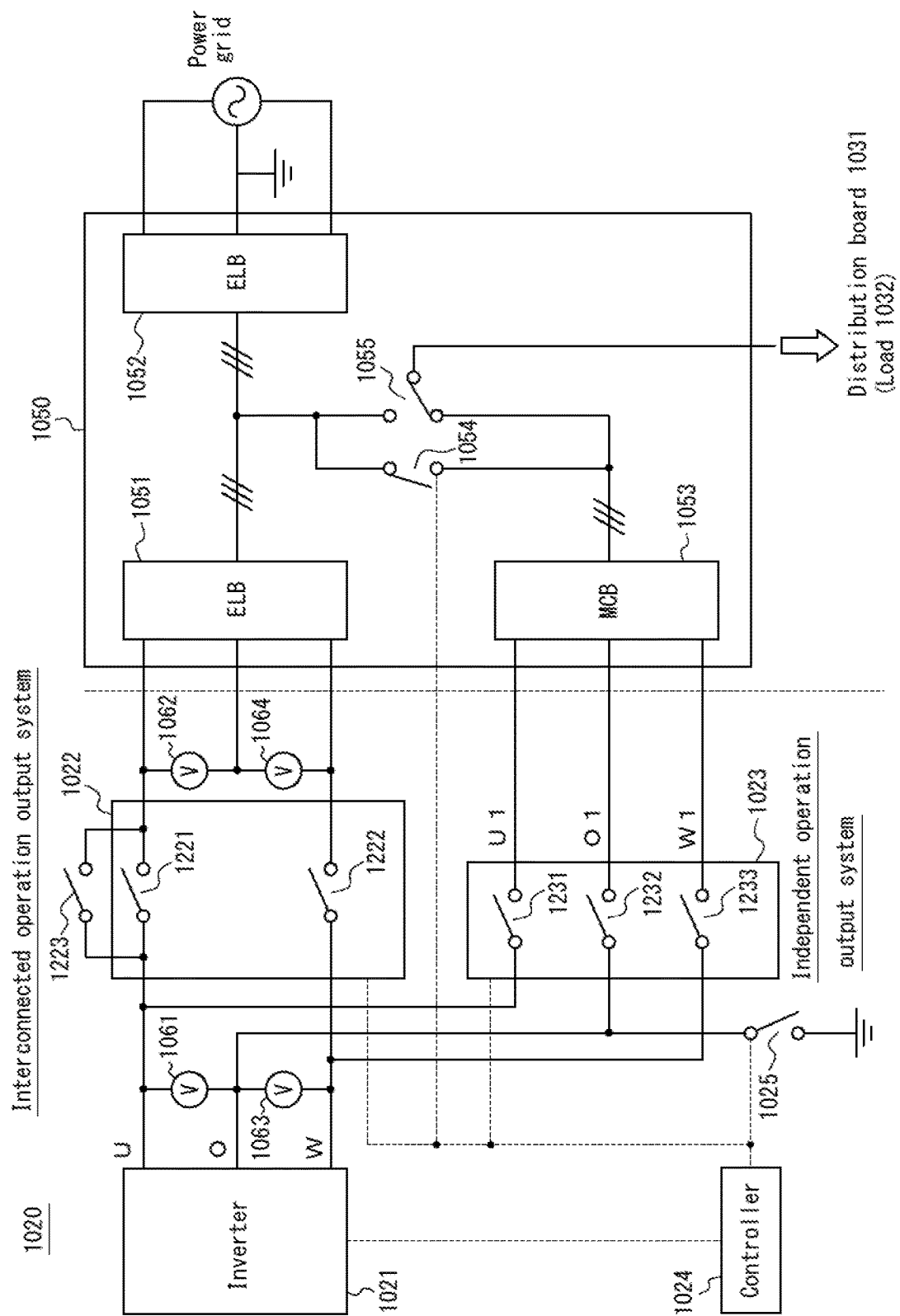
FIG. 8 is a more detailed circuit configuration diagram of the power control system according to the second embodiment.

FIG. 8 is a more detailed circuit configuration diagram related to the power control apparatus 1020 and the distribution board 1050. In the example in FIG. 8, the power grid is a 200 V single-phase three-wire system. In greater detail, the power control apparatus 1020 includes two interconnection relays 1221 and 1222 (first and second interconnection relays) for interconnecting or paralleling off the inverter 1021 to or from the power grid. The interconnection relays 1221 and 1222 are located inside the power control apparatus 1020. To reduce inrush current, the power control apparatus 1020 includes a rush relay 1223 in parallel with the interconnection relay 1221. Here, the inrush current refers to a current, flowing at the start of the power supply, that is larger than the current that regularly flows.

The rush relay 1223 is for preventing the inverter 1021 from breaking due to inrush current generated at the start of interconnected operation. In FIG. 8, the power control apparatus 1020 is illustrated as including the rush relay 1223, but embodiments are not limited to this configuration. The power control apparatus 1020 need not include the rush relay 1223.

The power control apparatus 1020 includes three independent operation relays 1231, 1232, and 1233 for connecting the inverter 1021 and the load 1032 during independent operation. The voltage lines and neutral line for supplying electric power from the inverter 1021 to the load 1032 during independent operation branch off from between the inverter 1021 and the interconnection relays 1221 and 1222. The independent operation relays 1231, 1232, and 1233 are located between the branch point and the distribution board 1050. In the example in FIG. 8, the independent operation relays 1231, 1232, and 1233 are located inside the power control apparatus 1020. The independent operation relay 1231 is designated as the first independent operation relay, and the independent operation relay 1233 is designated as the second independent operation relay, but these designations are not limiting.

The power control apparatus 1020 includes a reference potential relay 1025 for setting the neutral phase (O-phase) of the independent operation output system to a reference potential. The reference potential relay 1025 is provided in the O-phase. As one example, the reference potential is obtained by grounding the O-phase through the reference potential relay 1025. Here, the certification standard of an electricity storage system prescribes grounding of either one of the phases in the case of a single-phase two-wire system and grounding of any one of the phases of an independent operation output system in the case of three-wire connection. This requirement is satisfied by grounding the O-phase through the reference potential relay 1025. The reference potential may be 0 V or a different value.

The power control apparatus 1020 further includes voltage sensors 1061 and 1062 (first set of voltage sensors). The voltage sensor 1061 is installed between the interconnection relay 1221 and the inverter 1021, and the voltage sensor 1062 is installed between the interconnection relay 1221 and the power grid. Similarly, the power control apparatus 1020 further includes voltage sensors 1063 and 1064 (second set of voltage sensors). The voltage sensor 1063 is installed between the interconnection relay 1222 and the inverter 1021, and the voltage sensor 1064 is installed between the interconnection relay 1222 and the power grid. The installation of voltage sensors in the interconnected operation output system of the power control system that interconnects with the power grid is prescribed. Hence, the voltage sensors 1061 to 1064 are conventionally installed in accordance with this prescription. In FIG. 8, the voltage sensors 1061 and 1062 are designated as the first set of voltage sensors, and the voltage sensors 1063 and 1064 as the second set of voltage sensors, but these designations are not limiting. The designations of the first and second sets of voltage sensors may be switched.

As illustrated in FIG. 8, the power grid bypass relay 1054 is located between the independent operation output system and the interconnected operation output system. In the example in FIG. 8, the power grid bypass relay 1054 is located inside the distribution board 1050, but this configuration is not limiting. The power grid bypass relay 1054 may be located inside the power control apparatus 1020. The wiring inside the distribution board 1050 is a single-phase three-wire system. In other words, the U-phase, O-phase, and W-phase of the ELB 1051 are connected to the U-phase, O-phase, and W-phase of the ELB 1052 respectively. The U1-phase, O1-phase, and W1-phase of the MCB 1053 are connected to the U-phase, O-phase, and W-phase of the ELBs 1051 and 1052, respectively, through the power grid bypass relay 1054. In FIG. 8, the wires in the single-phase three-wire system are indicated by three diagonal lines for the sake of simplicity.

In this way, the power control apparatus 1020 has independent operation relays 1231, 1232, and 1233 for supplying power from the power generation system, such as the solar cell 1011 and the storage cell 1012, to the load 1032 during independent operation. A typical relay, however, sometimes does not operate when desired for a physical or electrical reason, such as inrush current, vibration, or unintentional shock. The reason why the relay does not operate may, for example, be a phenomenon in which a contact made of a metal material is welded or may be an unintended problem in the circuit that operates the relay. Welding is a phenomenon in which a power line inside the relay cannot be separated for the aforementioned reasons. For example, it is assumed that if interconnected operation starts without the state of the independent operation relays 1231, 1232, and 1233 having been detected before the start of interconnected operation, electric power from the power generation system will also flow into the independent operation output system, causing unintended reverse power flow, as described below. Accordingly, a power control system for detecting the state of the independent operation relays 1231, 1232, and 1233 and a control method for the power control system is necessary. The state of the independent operation relays 1231, 1232, and 1233 refers to either the on state or the off state. A relay is described below as not operating because of having been welded to be in constant contact (i.e. so that the relay is always on).

Costs increase when a detection circuit having a welding detection function is provided inside an individual relay, for example when a peripheral circuit for detection, such as a control circuit, is further included. Using the present method can prevent a large increase in costs as compared to the above case. The power control system according to an embodiment is also simpler than using a circuit system configured by combining these circuits for detecting the welding state.

Next, the operations of each relay during interconnected operation and during independent operation are described.

Figure 9:
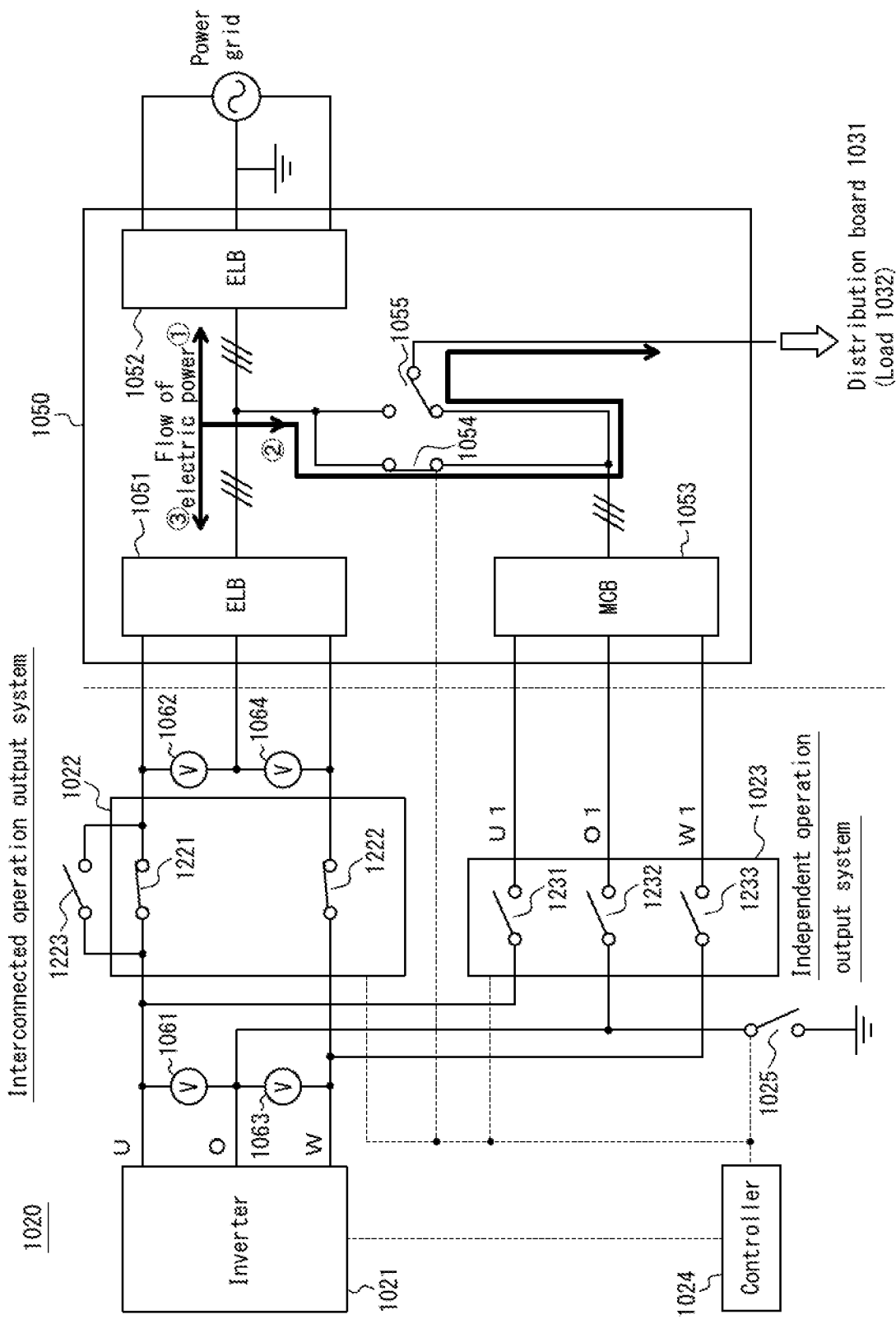
FIG. 9 illustrates operations of each relay during interconnected operation.

FIG. 9 illustrates operations of each relay during interconnected operation. Focusing on the inside of the power control apparatus 1020, during interconnected operation, the interconnection relays 1221 and 1222 are used, whereas the rush relay 1223, the independent operation relays 1231 to 1233, and the reference potential relay 1025 normally remain off. On the other hand, focusing on the inside of the distribution board 1050, the power grid bypass relay 1054 is turned on because power grid voltage is present during interconnected operation. As illustrated in FIG. 8, the changeover switch 1055 is connected to the terminal on the independent operation output system side.

By the relays operating in this way, electric power flows in the direction indicated by the three arrows in FIG. 9. Specifically, in the first flow, electric power generated by the solar cell 1011 flows in reverse through the interconnection relays 1221 and 1222 to the power grid by the sale of power. In the second flow, electric power is supplied from the power grid to the load 1032 by the purchase of power. In the third flow, electric power is supplied from the power grid to the storage cell 1012 to charge the storage cell 1012.

Figure 10:
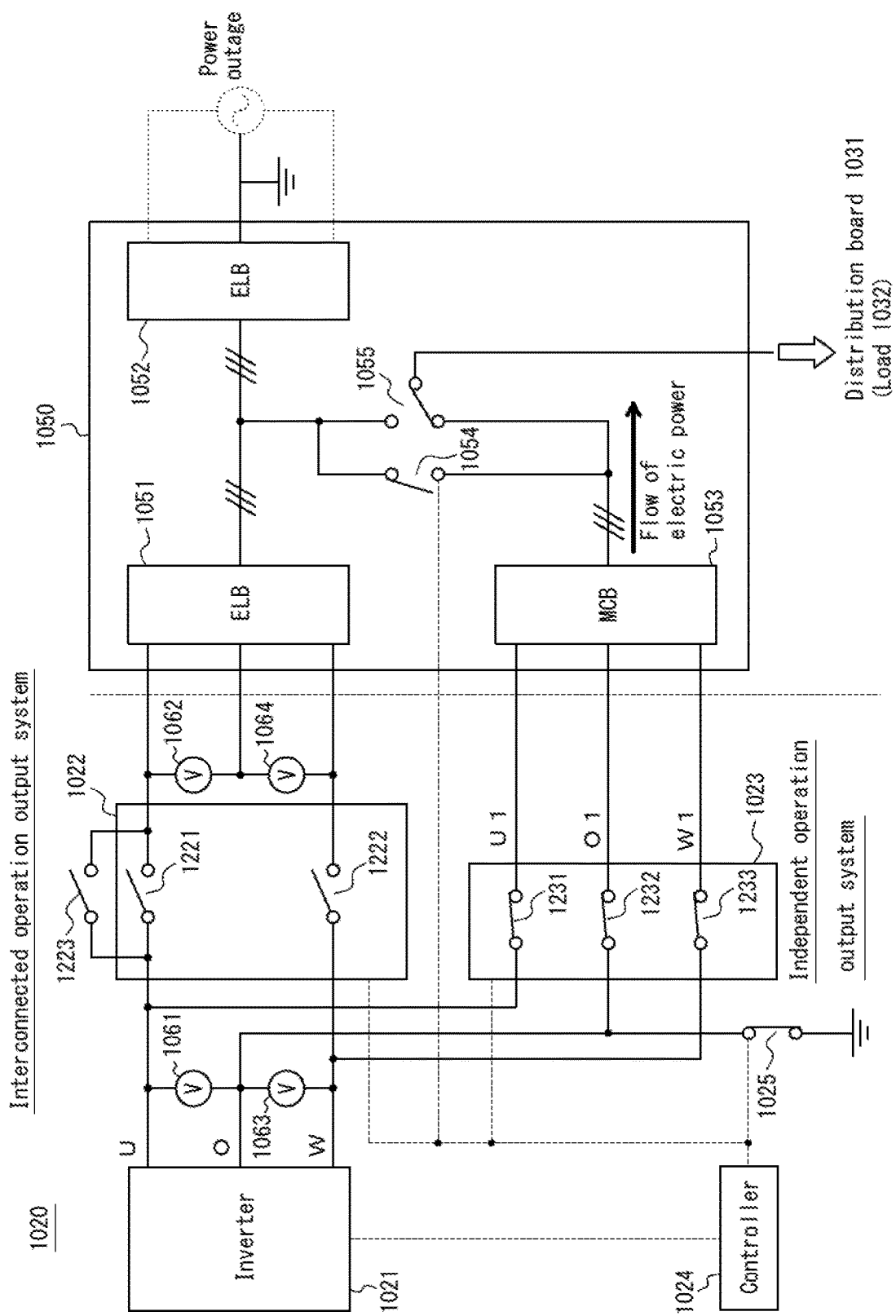
FIG. 10 illustrates operations of each relay during independent operation.

FIG. 10 illustrates operations of each relay during independent operation. Focusing on the inside of the power control apparatus 1020, during independent operation, the independent operation relays 1231, 1232, and 1233 and the reference potential relay 1025 are used, whereas the interconnection relays 1221 and 1222 and the rush relay 1223 normally remain off. On the other hand, focusing on the inside of the distribution board 1050, the power grid bypass relay 1054 is off because power grid voltage is not present during independent operation. As illustrated in FIG. 10, the changeover switch 1055 remains connected to the terminal on the independent operation output system side.

By the relays operating in this way, electric power flows in the direction indicated by the arrow in FIG. 10. Specifically, electric power is supplied from the solar cell 1011 and the storage cell 1012 in the power generation system to the load 1032 through the independent operation relays 1231, 1232, and 1233. Consequently, the power control apparatus 1020 can supply electric power stably from the power generation system to the load 1032 even during a power outage.

An inexpensive and simple method for detecting the welding state of the independent operation relays 1231, 1232, and 1233 using the power control system according to an embodiment is described below. First, a method for detecting welding of the independent operation relays 1231, 1232, and 1233 after switching to interconnected operation is described.

Figure 11:
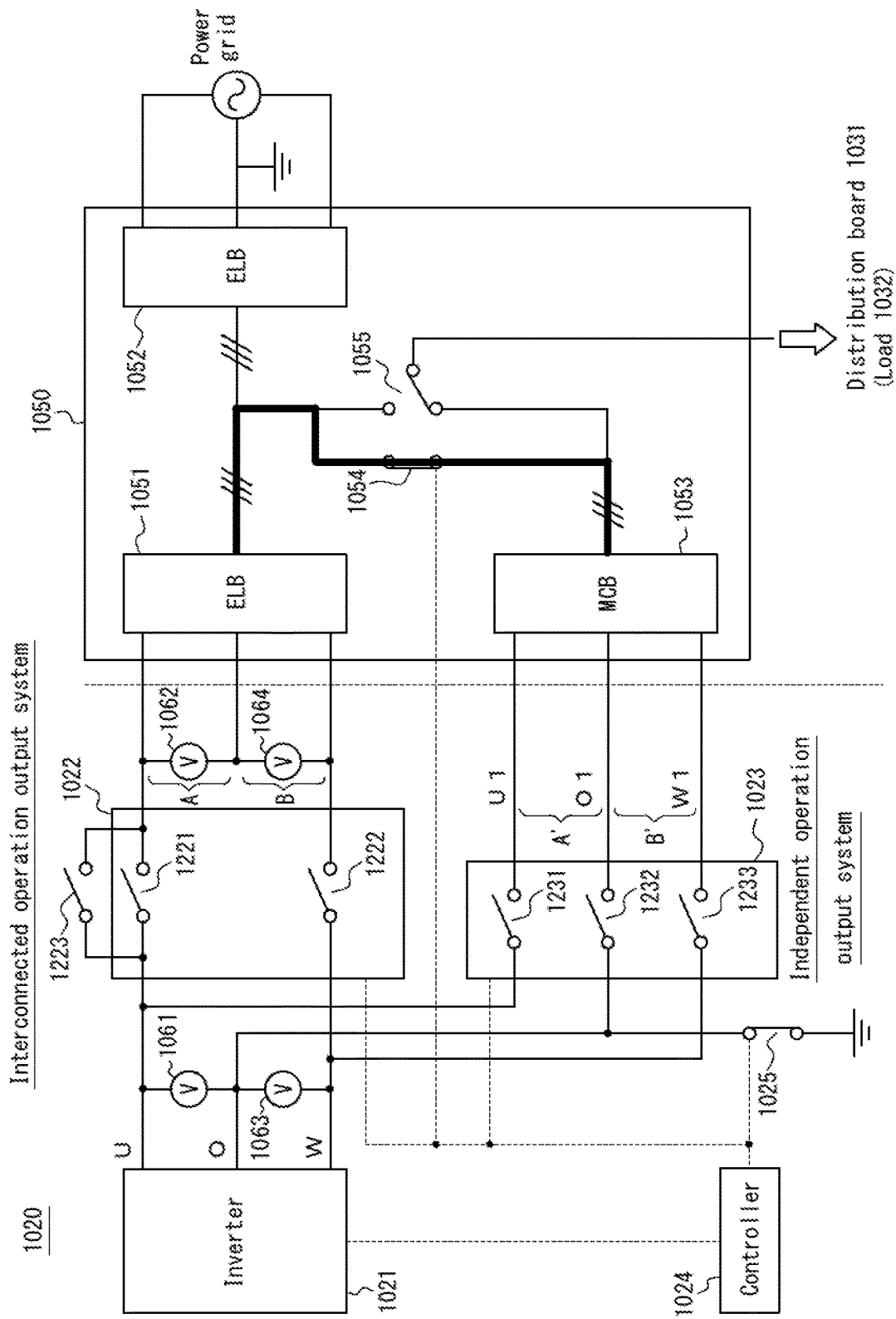
FIG. 11 illustrates operations when detecting welding of the independent operation relays after switching to interconnected operation.

FIG. 11 illustrates operations when detecting welding of the independent operation relays 1231, 1232, and 1233 after switching to interconnected operation. As illustrated in FIG. 9, during interconnected operation, the reference potential relay 1025 remains off. Consequently, the potential of the O-phase on the inverter 1021 side is not determined. The voltage sensor 1061 cannot measure the voltage between the U-phase and the O-phase, and the voltage sensor 1063 cannot measure the voltage between the W-phase and the O-phase.

In the power control system according to an embodiment, the controller 1024 newly performs control to turn the reference potential relay 1025 on before the start of interconnected operation, as illustrated in FIG. 11. In this way, the O-phase is grounded, and a reference potential (earth (E)) of 0 V is obtained. At this time, the voltage sensor 1061 can measure the voltage between the U-phase and the O-phase (U-E) on the inverter 1021 side, and the voltage sensor 1063 can measure the voltage between the W-phase and the O-phase (W-E) on the inverter 1021 side. On the power grid side, the O-phase is grounded from the start. Hence, the voltage sensor 1062 can measure the voltage between the U-phase and the O-phase (U-E) on the power grid side, and the voltage sensor 1064 can measure the voltage between the W-phase and the O-phase (W-E) on the power grid side.

As illustrated in FIG. 9, the power grid bypass relay 1054 is on during interconnected operation. As a result, the interconnected operation output system and the independent operation output system are at the same potential. In other words, the voltage A of the interconnected operation output system becomes the same as the voltage A' of the independent operation output system, as illustrated in FIG. 11. Consequently, the voltage between the U1-phase and the O1-phase (U1-E) of the independent operation output system can be measured by the voltage sensor 1062. Similarly, the voltage B of the interconnected operation output system becomes the same as the voltage B' of the independent operation output system. Consequently, the voltage between the W1-phase and the O1-phase (W1-E) of the independent operation output system can be measured by the voltage sensor 1064.

Subsequently, the controller 1024 judges whether each relay is welded on the basis of the voltage values measured by the voltage sensors 1061 and 1062. If the values are the same, the controller 1024 judges that at least one of the interconnection relay 1221, rush relay 1223, or independent operation relays 1231 and 1232 is not off as normal before the start of interconnected operation and is welded. Hence, the controller 1024 outputs an error. The values are not limited to being equal. It suffices for the difference between the voltage values measured by the voltage sensor 1061 and the voltage sensor 1062 to be within a certain threshold range, such as ±5%. If the values are different, the controller 1024 judges that none of the interconnection relay 1221, rush relay 1223, and independent operation relays 1231 and 1232 is welded.

Similarly, the controller 1024 judges whether each relay is welded on the basis of the voltage values measured by the voltage sensors 1063 and 1064. If the values are the same, the controller 1024 judges that at least one of the interconnection relay 1222 or independent operation relays 1232 and 1233 is not off as normal before the start of interconnected operation and is welded. Hence, the controller 1024 outputs an error. If the values are different, the controller 1024 judges that none of the interconnection relay 1222 and independent operation relays 1232 and 1233 is welded.

The power control system according to an embodiment can judge the welding state of the independent operation relays 1231, 1232, and 1233 at the start of interconnected operation by using only simple relays, without using expensive relays individually provided with a detection circuit having a welding detection function. In other words, the power control system according to an embodiment achieves inexpensive and simple detection of the welding state of not only the interconnection relays 1221 and 1222 but also the independent operation relays 1231, 1232, and 1233.

Next, a method for detecting welding of the independent operation relays 1231, 1232, and 1233 after switching to independent operation is described.

Figure 12:
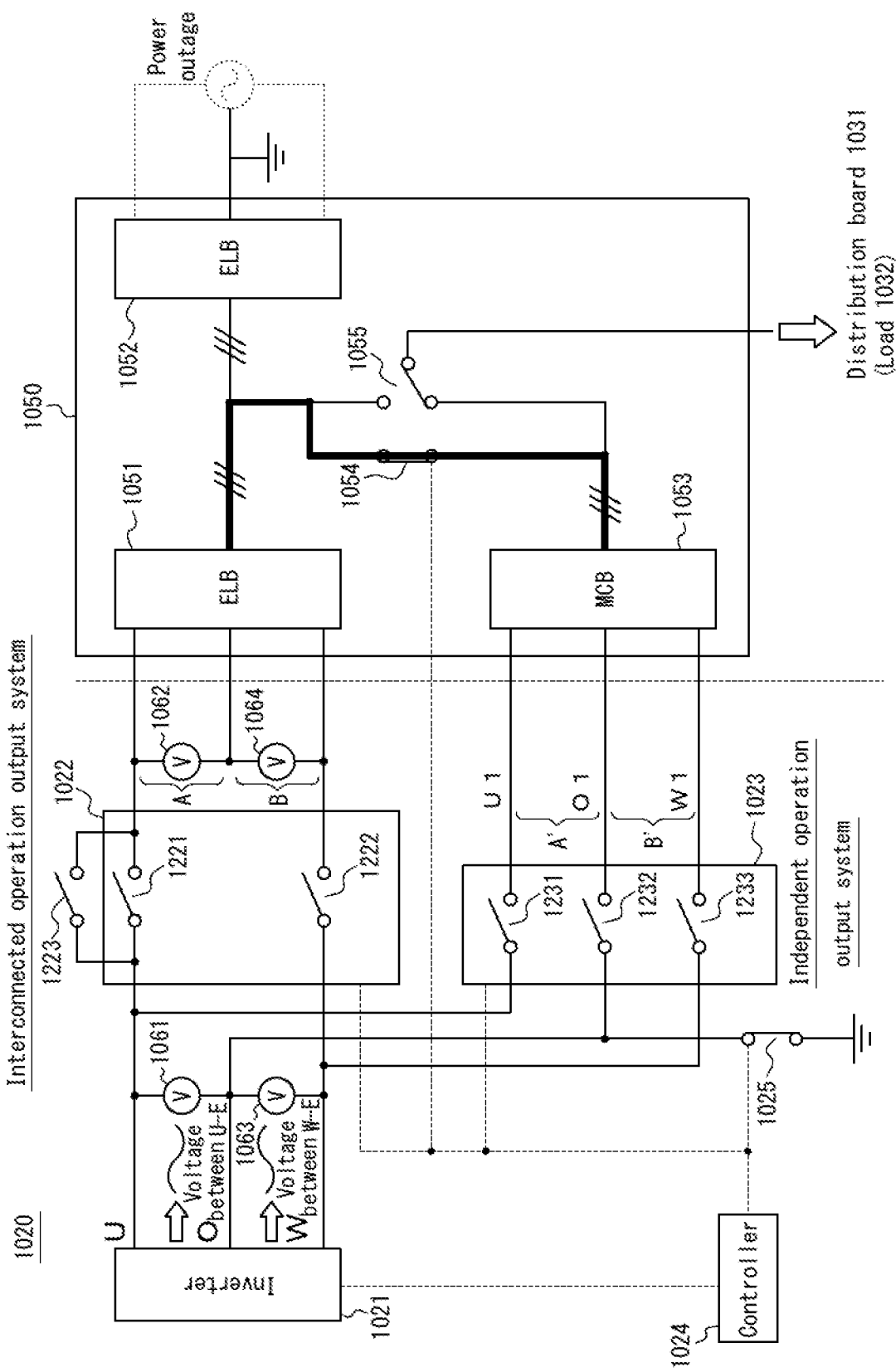
FIG. 12 illustrates operations when detecting welding of the independent operation relays after switching to independent operation.

FIG. 12 illustrates operations when detecting welding of the independent operation relays 1231, 1232, and 1233 after switching to independent operation. During independent operation, the reference potential relay 1025 is on. Consequently, the O-phase is grounded, and a reference potential (earth (E)) of 0 V is obtained. Hence, the voltage sensor 1061 can measure the voltage between the U-phase and the O-phase, and the voltage sensor 1063 can measure the voltage between the W-phase and the O-phase.

As illustrated in FIG. 10, the power grid bypass relay 1054 is off during independent operation. Accordingly, the controller 1024 performs control to turn the power grid bypass relay 1054 on once before the start of independent operation. As a result, the interconnected operation output system and the independent operation output system are at the same potential. In other words, the voltage A of the interconnected operation output system becomes the same as the voltage A' of the independent operation output system, as illustrated in FIG. 12. Consequently, the voltage between the U1-phase and the O1-phase (U1-E) of the independent operation output system can be measured by the voltage sensor 1062. Similarly, the voltage B of the interconnected operation output system becomes the same as the voltage B' of the independent operation output system. Consequently, the voltage between the W1-phase and the O1-phase (W1-E) of the independent operation output system can be measured by the voltage sensor 1064.

The inverter 1021 outputs a micro voltage before the start of independent operation, because power from the power grid is not supplied during independent operation, unlike during interconnected operation. The micro voltage is AC voltage with an output time corresponding to 1 cycle or more of the AC voltage. A micro voltage output for less than 1 cycle may lead to misdetection during welding detection. Hence, the reason for outputting micro voltage for 1 cycle or more may also be to increase detection accuracy. An excessively long output time is time consuming, however, and the micro voltage might not be distinguishable from electric power flowing during interconnected operation. Therefore, the output time can, for example, be set to 1 cycle or more and 10 cycles or less. The output time may, for example, be set to 2 cycles or more and 6 cycles or less.

It suffices for the voltage value of the micro voltage to be set to a value sufficiently lower than AC 100 V. Specifically, the micro voltage can, for example, be set to a value that is larger than AC 0 V and is AC 10 V or less. Considering the pain felt during contact by the operator, the micro voltage may be set to a value that is larger than AC 0 V and is AC 5 V or less.

By the inverter 1021 outputting a micro voltage, the voltage sensors 1061 to 1064 can measure the respective voltages. If the interconnection relays 1221 and 1222, the rush relay 1223, and the independent operation relays 1231, 1232, and 1233 are not welded, i.e. if these relays are off as normal, then power is not supplied from the power grid. The voltage values of the voltage sensors 1062 and 1064 therefore become 0 V. On the other hand, if at least one of the interconnection relay 1221, the rush relay 1223, or the independent operation relays 1231 and 1232 is welded, the voltage value of the voltage sensor 1062 becomes the same as the voltage value of the voltage sensor 1061. Similarly, if at least one of the interconnection relay 1222 or the independent operation relays 1232 and 1233 is welded, the voltage value of the voltage sensor 1064 becomes the same as the voltage value of the voltage sensor 1063.

The controller 1024 judges whether each relay is welded on the basis of the voltage values measured by the voltage sensors 1061 and 1062. If the values are the same, the controller 1024 judges that at least one of the interconnection relay 1221, rush relay 1223, or independent operation relays 1231 and 1232 is not off as normal before the start of independent operation and is welded. Hence, the controller 1024 outputs an error. If the values are different, the controller 1024 judges that none of the interconnection relay 1221, rush relay 1223, and independent operation relays 1231 and 1232 is welded.

Similarly, the controller 1024 judges whether each relay is welded on the basis of the voltage values measured by the voltage sensors 1063 and 1064. If the values are the same, the controller 1024 judges that at least one of the interconnection relay 1222 or independent operation relays 1232 and 1233 is not off as normal before the start of independent operation and is welded. Hence, the controller 1024 outputs an error. If the values are different, the controller 1024 judges that none of the interconnection relay 1222 and independent operation relays 1232 and 1233 is welded.

The power control system according to an embodiment can judge the welding state of the independent operation relays 1231, 1232, and 1233 even at the start of independent operation by using only simple relays, without using expensive relays individually provided with a detection circuit having a welding detection function. In other words, the power control system according to an embodiment achieves inexpensive and simple detection of the welding state of not only the interconnection relays 1221 and 1222 but also the independent operation relays 1231, 1232, and 1233.

Here, the operations are described for the case of the independent operation relays being welded when power is restored after a power outage, i.e. when switching from independent operation to interconnected operation.

Figure 13:
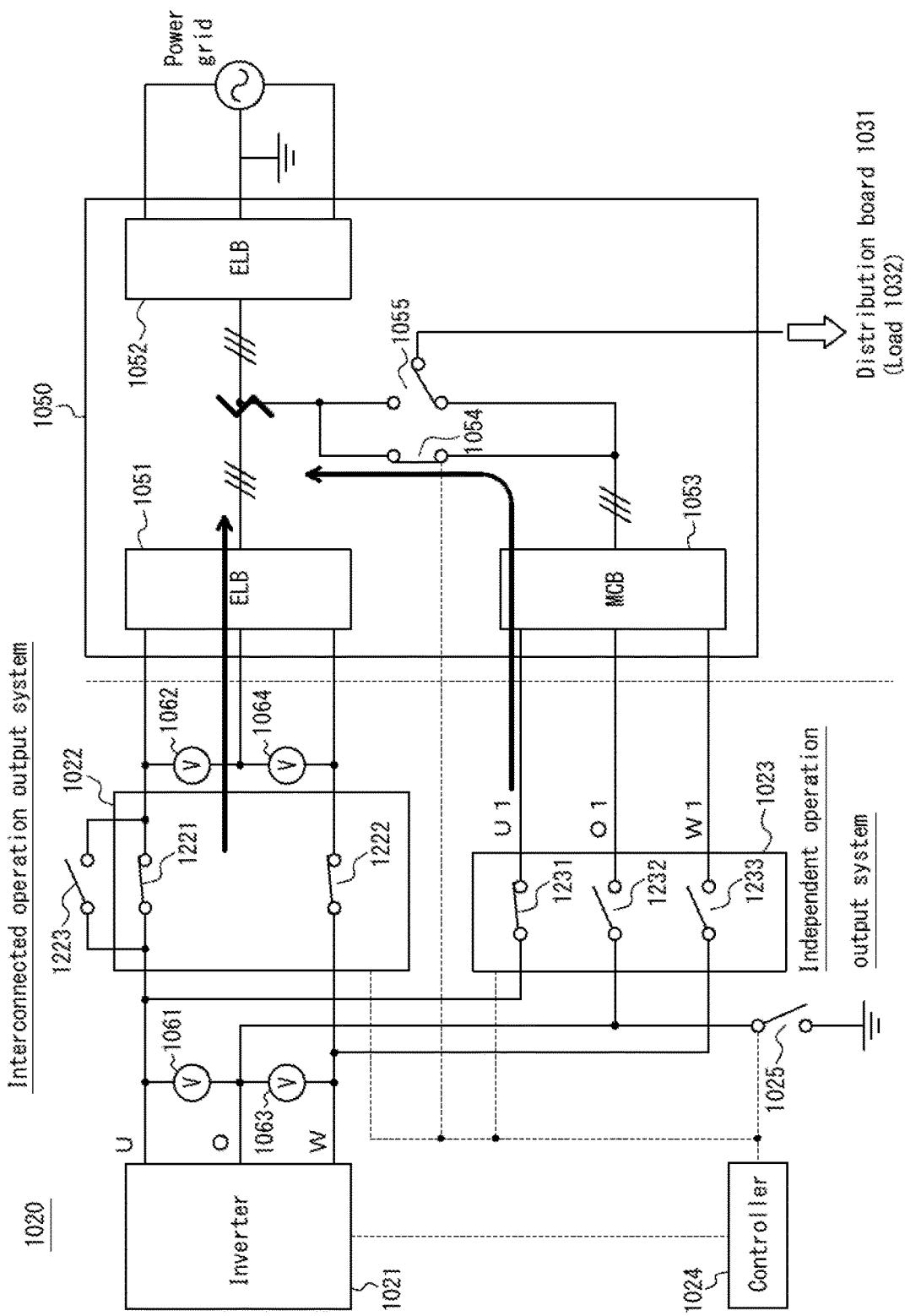
FIG. 13 illustrates the case of an independent operation relay being welded during interconnected operation.

FIG. 13 illustrates the case of an independent operation relay being welded during interconnected operation. In FIG. 13, the independent operation relay 1231 is welded, for example, unlike the normal relay operation during interconnected operation illustrated in FIG. 9. During interconnected operation, the output from the inverter 1021 is assumed to flow to the power grid through the interconnection relays 1221 and 1222. In the aforementioned case, however, output from the inverter 1021 also ends up flowing to the independent operation output system unintentionally. At this time, electric power passing through different paths collides inside the distribution board 1050, as illustrated in FIG. 13. It is assumed that when electric power collides, an excessive voltage is applied to electrical circuits such as capacitors, causing the electrical circuits to burn out. It is also assumed that unintended reverse power flow will occur.

To reduce the occurrence of such an unintended phenomenon, welding of each relay, including the independent operation relays 1231, 1232, and 1233, is detected before the start of interconnected operation, as described above. When the controller 1024 judges that one of the relays is welded and outputs an error, the controller 1024 stops operation of the inverter 1021. In this way, the occurrence of an unintended phenomenon when one of the independent operation relays 1231, 1232, and 1233 is welded can be reduced, improving the safety before the start of interconnected operation.

Next, with reference to the flowcharts in FIG. 14A and FIG. 14B, the operations of the power control system according to an embodiment are described in detail. The operations of the power control system differ between the start of interconnected operation and the start of independent operation.

The controller 1024 confirms whether power is being supplied from the power grid (step S300). When power is being supplied from the power grid, the process proceeds to step S301. When power is not being supplied from the power grid, the process proceeds to step S400 in FIG. 14B. First, the operations at the start of interconnected operation are described with reference to FIG. 14A.

The controller 1024 turns the reference potential relay 1025 on (step S301). In this way, the O-phase is grounded, and a reference potential of 0 V is obtained.

Next, the controller 1024 compares the voltage values measured by the voltage sensors 1061 and 1062 (step S302). If the voltage values are the same, the process proceeds to step S303. If the voltage values are different, the process proceeds to step S304.

When the voltage values are the same, the controller 1024 judges that at least one of the interconnection relay 1221, rush relay 1223, or independent operation relays 1231 and 1232 is welded, outputs an error, and stops the inverter 1021 (step S303).

When the voltage values are different, the controller 1024 judges that none of the interconnection relay 1221, rush relay 1223, and independent operation relays 1231 and 1232 is welded. The controller 1024 then compares the voltage values measured by the voltage sensors 1063 and 1064 (step S304). If the voltage values are the same, the process proceeds to step S305. If the voltage values are different, the process proceeds to step S306.

When the voltage values are the same, the controller 1024 judges that at least one of the interconnection relay 1222 or independent operation relays 1232 and 1233 is welded, outputs an error, and stops the inverter 1021 (step S305).

When the voltage values are different, the controller 1024 detects that none of the interconnection relays 1221 and 1222, rush relay 1223, and independent operation relays 1231, 1232, and 1233 is welded. The controller 1024 then turns the reference potential relay 1025 off (step S306).

Subsequently, the controller 1024 turns the interconnection relay 1222 and the rush relay 1223 on (step S307).

Subsequently, after the inrush current generated at the start of interconnected operation subsides, the controller 1024 turns the interconnection relay 1221 on (step S308).

The controller 1024 then turns the rush relay 1223 off (step S309).

After the above operations, interconnected operation starts (step S310).

Next, the operations at the start of independent operation are described with reference to FIG. 14B.

When power is not being supplied from the power grid, the controller 1024 switches to independent operation mode (step S400). At this time, the controller 1024 turns the reference potential relay 1025 on. In this way, the O-phase is grounded, and a reference potential of 0 V is obtained.

Subsequently, the controller 1024 turns the power grid bypass relay 1054 on (step S401). As a result, the interconnected operation output system and the independent operation output system are at the same potential.

Next, the inverter 1021 outputs AC voltage (step S402). The output time may be 2 cycles or more and 6 cycles or less of the AC voltage.

Next, the controller 1024 compares the voltage values measured by the voltage sensors 1061 and 1062 (step S403). If the voltage values are the same, the process proceeds to step S404. If the voltage values are different, the process proceeds to step S405.

When the voltage values are the same, the controller 1024 judges that at least one of the interconnection relay 1221, rush relay 1223, or independent operation relays 1231 and 1232 is welded and outputs an error (step S404).

If the voltage values are different, the controller 1024 judges that none of the interconnection relay 1221, rush relay 1223, and independent operation relays 1231 and 1232 is welded and then compares the voltage values measured by the voltage sensors 1063 and 1064 (step S405). If the voltage values are the same, the process proceeds to step S406. If the voltage values are different, the process proceeds to step S407.

When the voltage values are the same, the controller 1024 judges that at least one of the interconnection relay 1222 or independent operation relays 1232 and 1233 is welded and outputs an error (step S406).

When the voltage values are different, the controller 1024 detects that none of the interconnection relays 1221 and 1222, rush relay 1223, and independent operation relays 1231, 1232, and 1233 is welded. The controller 1024 also reconfirms whether power is being supplied from the power grid (step S407). This is to confirm whether power has been restored unintentionally at the start of independent operation. When power is being supplied from the power grid and has been restored unintentionally, the process returns to step S300. When power is not being supplied from the power grid, the process proceeds to step S408.

Subsequently, the controller 1024 turns the power grid bypass relay 1054 off (step S408).

The controller 1024 also turns the independent operation relays 1231, 1232, and 1233 on (step S409).

As a result, independent operation starts (step S410).

The power control system according to an embodiment with the above configuration can thus judge the welding state of relays inside the power control apparatus 1020 at the start of interconnected operation and at the start of independent operation without using expensive relays individually provided with a detection circuit having a welding detection function. The power control system according to an embodiment thus achieves inexpensive and simple detection of the welding state of the independent operation relays 1231, 1232, and 1233 inside the power control apparatus 1020.

The power grid bypass relay 1054, the changeover switch 1055, and the like have been described above as being located in the distribution board 1050, but this configuration is not limiting. Specifically, the power grid bypass relay 1054, the changeover switch 1055, and the like may be located inside the power control apparatus 1020. In this case, all of the components of the distribution board 1050 may be located within the power control apparatus 1020. In addition to the power grid bypass relay 1054 and the changeover switch 1055, at least one of the ELB 1051, the ELB 1052, or the MCB 1053 may be located within the power control apparatus 1020.

It will be clear to a person of ordinary skill in the art that the present disclosure may be implemented in certain ways other than the above embodiments without departing from the spirit or essential features thereof. Accordingly, the above explanation merely provides examples that are in no way limiting. The scope of the present disclosure is to be defined by the appended claims, not by the above explanation. Among all changes, various changes that are within the range of equivalents are considered to be included therein.

The invention claimed is:

1. A power control system comprising:
a first independent operation relay and a second independent operation relay for connecting an inverter to a load during independent operation;
a reference potential relay configured to set a neutral phase of an independent operation output system to a reference potential;
a first interconnection relay and a second interconnection relay located in an interconnected operation output system and configured to interconnect or parallel off the inverter to or from a power grid;
a first set of voltage sensors respectively installed between the first interconnection relay and the inverter and between the first interconnection relay and the power grid;
a second set of voltage sensors respectively installed between the second interconnection relay and the inverter and between the second interconnection relay and the power grid;
a power grid bypass relay located between the independent operation output system and the interconnected operation output system; and
a controller configured to turn the power grid bypass relay and the reference potential relay on and then to judge a state of the first independent operation relay and of the second independent operation relay on the basis of voltage values measured by the first set of voltage sensors and the second set of voltage sensors.

2. The power control system of claim 1, wherein the controller is configured to stop operation of the inverter when judging that the first independent operation relay or the second independent operation relay is not operating.

3. The power control system of claim 1, wherein the controller is configured to output a micro voltage from the inverter and to acquire a voltage value measured by each voltage sensor.

4. The power control system of claim 3, wherein the controller is configured to output a micro voltage which is AC voltage, and an output time of the micro voltage corresponds to 1 cycle or more of the AC voltage.

5. The power control system of claim 4, wherein the controller is configured to output a micro voltage the output time of which corresponds to 2 cycles or more and 10 cycles or less of the AC voltage.

6. The power control system of claim 3, wherein the controller is configured to output a micro voltage a voltage value of which is larger than AC 0 V and is AC 10 V or less.

7. A control method comprising:
turning on a power grid bypass relay located between an independent operation output system and an interconnected operation output system;
turning a reference potential relay on to set a neutral phase of the independent operation output system to a reference potential;
comparing voltage values measured by a first set of voltage sensors and a second set of voltage sensors, the first set of voltage sensors being respectively installed between a first interconnection relay and an inverter and between the first interconnection relay and a power grid, the second set of voltage sensors being respectively installed between a second interconnection relay and the inverter and between the second interconnection relay and the power grid, the first interconnection relay and the second interconnection relay being configured to interconnect or parallel off the inverter to or from the power grid; and
judging a state of a first independent operation relay and of a second independent operation relay.

* * * * *